United States Patent
Tanaka

(10) Patent No.: US 7,224,615 B2
(45) Date of Patent: May 29, 2007

(54) NON-VOLATILE SEMICONDUCTOR MEMORY DEVICE ADAPTED TO STORE A MULTI-VALUED IN A SINGLE MEMORY CELL

(75) Inventor: Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/337,613

(22) Filed: Jan. 24, 2006

(65) Prior Publication Data

US 2006/0120158 A1 Jun. 8, 2006

Related U.S. Application Data

(63) Continuation of application No. 10/871,110, filed on Jun. 21, 2004.

(30) Foreign Application Priority Data

Dec. 9, 2003 (JP) .............................. 2003-410237

(51) Int. Cl.
*G11C 11/34* (2006.01)
(52) U.S. Cl. .......................... 365/185.22; 365/185.18; 365/185.24; 365/189.01; 365/189.07; 365/185.19; 365/185.03
(58) Field of Classification Search ........... 365/185.22, 365/185.18, 185.24, 189.01, 189.07, 185.19, 365/185.03
See application file for complete search history.

(56) References Cited

U.S. PATENT DOCUMENTS 5,465,235 A * 11/1995 Miyamoto ............. 365/185.25
5,515,324 A * 5/1996 Tanaka ................... 365/185.09
5,570,315 A * 10/1996 Tanaka et al. ......... 365/185.22
5,615,165 A * 3/1997 Tanaka et al. ......... 365/230.06
5,691,941 A * 11/1997 Imamiya et al. ......... 365/185.3
5,751,634 A * 5/1998 Itoh ...................... 365/185.17
5,774,397 A 6/1998 Endoh et al.
5,844,841 A * 12/1998 Takeuchi et al. ....... 365/185.03
5,917,756 A * 6/1999 Imamiya et al. ......... 365/185.3
6,014,330 A 1/2000 Endoh et al.
6,055,181 A * 4/2000 Tanaka et al. ......... 365/185.03

(Continued)

FOREIGN PATENT DOCUMENTS

JP 10-228786 8/1998

(Continued)

OTHER PUBLICATIONS

G. J. Hemink, et al., Symposium on VLSI Technology Digest of Technical Papers, pp. 129-130, Fast and Accurate Programming Method for Multi-Level Nand EEPROMS:, 1995.

*Primary Examiner*—Viet Q. Nguyen
(74) *Attorney, Agent, or Firm*—Oblon, Spivak, McClelland, Maier & Neustadt, P.C.

(57) ABSTRACT

A non-volatile semiconductor memory device includes a non-volatile memory cell and a write circuit that is adapted to write data to the memory cell by supplying a write voltage and a write control voltage to the memory cell to change the write state of the memory cell, changing the supply of the write control voltage to reduce the rate of changing the write state, further changing the supply of the write control voltage to control the reduced rate of changing the write state and terminating the write operation to the memory cell while the rate of changing the write state is reduced.

6 Claims, 14 Drawing Sheets

U.S. PATENT DOCUMENTS

| | | | |
|---|---|---|---|
| 6,178,115 B1 * | 1/2001 | Shibata et al. | 365/185.03 |
| 6,288,935 B1 * | 9/2001 | Shibata et al. | 365/185.03 |
| 6,473,338 B2 * | 10/2002 | Sugimura | 365/185.03 |
| 6,496,418 B2 | 12/2002 | Kawahara et al. | |
| 6,522,580 B2 | 2/2003 | Chen et al. | |
| 6,643,188 B2 | 11/2003 | Tanaka et al. | |
| 6,657,891 B1 * | 12/2003 | Shibata et al. | 365/185.03 |
| 6,683,810 B2 | 1/2004 | Sakamoto | |
| 6,744,670 B2 * | 6/2004 | Tamada et al. | 365/185.19 |
| 6,798,697 B2 * | 9/2004 | Hosono et al. | 365/185.12 |
| 6,831,858 B2 | 12/2004 | Hirano et al. | |
| 6,850,435 B2 * | 2/2005 | Tanaka | 365/185.08 |
| 6,876,578 B2 * | 4/2005 | Shibata et al. | 365/185.03 |
| 6,922,364 B2 * | 7/2005 | Kojima | 365/185.33 |
| 6,982,904 B2 * | 1/2006 | Shiga | 365/185.09 |
| 2004/0047183 A1 | 3/2004 | Tanaka et al. | |

FOREIGN PATENT DOCUMENTS

JP  2003-196988  7/2003

* cited by examiner

NON-VOLATILE SEMICONDUCTOR MEMORY DEVICE ADAPTED TO STORE A MULTI-VALUED IN A SINGLE MEMORY CELL

CROSS-REFERENCE TO RELATED APPLICATIONS

This application is a continuation of co-pending U.S. patent application No. Ser. 10/871,110, filed Jun. 21, 2004, which is based upon and claims the benefit of priority from prior Japanese Patent Applications No. 2003-410237, filed Dec. 9, 2003, the entire contents of each of which are incorporated herein by reference.

BACKGROUND OF THE INVENTION

1. Field of the Invention

This invention relates to an electrically data rewritable non-volatile semiconductor memory device. More particularly, it relates to a multi-value flash memory adapted to store a multi-valued data in a memory cell.

2. Description of the Related Art

In a flash memory, the accumulated electric charge of the floating gate of a memory cell transistor is changed as the stored data is erased and a new data is written there. Then, as a result, the threshold voltage is changed to store the data. For instance, the negative threshold voltage may be made to corresponds to a "1" data, whereas the positive threshold voltage may be made to corresponds to a "0" data.

In recent years, multi-value flash memories adapted to store a plurality of bits in a single memory cell have been developed to reduce the cost per bit and/or increase the storage capacity. In a memory device adapted to store two bits in a single memory cell, the memory cell has four threshold voltages depending on the data to be stored there.

A highly reliable memory device can be obtained by accurately controlling the threshold voltages of each memory cell. "Fast and Accurate Programming Method for Multi-level NAND EEPROMs, pp. 129–130, Digest of 1995 Symposium on VLSI Technology" proposes a method of writing data, raising the write voltage Vpgm at a rate, in order to precisely control the threshold voltages of each memory cell.

With the method proposed in the above cited document, the width of distribution of each threshold voltage can be controlled theoretically to as small as 0.2V by raising the write voltage Vpgm at a rate of 0.2V/10 μsec. Normally, the write voltage Vpgm is divided into a plurality of write pulses and the voltage Vpgm of the pulses is raised stepwise at a predetermined rate. This technique provides an effect similar to that of continuously raising the write voltage Vpgm. The threshold voltage is checked after applying each pulse to the memory cell and the write operation is terminated when the threshold voltage has got to a predetermined verification level.

Meanwhile, micronization of processing dimensions is in progress. This means that the gaps separating memory cells are made smaller and smaller to consequently give rise to various problems from the viewpoint of multi-valued flash memories. For instance, the distance separating floating gates is reduced to produce problems as pointed out below as a result of micronization.

Imagine two memory cells A and B arranged side by side. Assume that the data of the two memory cells are erased simultaneously and they are made to have a threshold voltage of −3V. Then, firstly a data is written into the memory cell A. As a result, its threshold voltage may be raised to 0.5V to 1V. Subsequently, another data that is different from the data written into the memory cell A is written into the memory cell B. As the threshold voltage of the memory cell B is raised to 1.5V to 2V, the electric potential of the floating gate of the memory cell A falls and its threshold voltage is raised, say, to 1V to 1.5V as a result of the capacitive coupling of the floating gates of the two memory cells.

In the above described instance, the difference of the threshold voltages of the memory cells A and B (read out margin) should be at least 0.5V. However, it is reduced to 0V as a result of the capacitive coupling of the floating gates of the two memory cells. Thus, the difference of the threshold voltages necessary for discriminating two different data is reduced and the read out margin disappears.

It may be conceivable to reduce the stepwise increment Dvpgm of the write voltage Vpgm in order to avoid this problem. For example, the distribution width of the threshold voltage is reduced from 0.5V to 0.1V to increase the write out margin by 0.4V by reducing the stepwise increment Dvpgm from 0.5V to 0.1V.

However, as the stepwise increment is reduced to ⅕ of the original value, the number of pulses becomes five times as many as the original number. Then, the write time will become five times as long as the original value to give rise to a new problem.

For example, Japanese Patent Application KOKAI Publication No. 2003-196988 discloses a technique of reducing the difference of the threshold voltages without reducing the stepwise increment Dvpgm of the write voltage Vpgm. With the disclosed technique, a write operation is conducted by supplying the write voltage that is stepwise incremented by Dvpgm and the write control voltage of 0V being applied to the bit line to the memory cell. When the memory cell approaches a predetermined write state, the write control voltage is raised from 0V to, for example, 0.4V to reduce the rate at which the threshold voltage is changed and the write operation to the memory cell is terminated while the rate of changing the threshold voltage is reduced.

As discussed above, with the technique disclosed in Japanese Patent Application KOKAI Publication No. 2003-196988, the write control voltage is raised during a write operation in order to reduce the rate of changing the threshold voltage. However, the rate of changing the threshold voltage returns to the original level sooner or later because the write voltage itself rises stepwise. Therefore, it is necessary to sufficiently reduce the rate of changing the threshold voltage and hence it takes time from the time when the rate of changing the threshold voltage is reduced to the time when the write operation is completed. Additionally, the performance of controlling the threshold voltage is not necessarily satisfactory.

Therefore, so far, any attempt at securing a write out margin and raising the reliability of a memory device is accompanied by the problem of an increased write time.

BRIEF SUMMARY OF THE INVENTION

In an aspect of the present invention, there is provided a non-volatile semiconductor memory device comprises: an electrically data rewritable non-volatile semiconductor memory cell; and a write circuit configured to write data to the memory cell by supplying a write voltage and a write control voltage to the memory cell to change the write state of the memory cell, changing the supply of the write control voltage to reduce the rate of changing the write state, further changing the supply of the write control voltage to control the reduced rate of changing the write state and terminating the write operation to the memory cell while the rate of changing the write state is reduced.

DETAILED DESCRIPTION OF THE INVENTION

Now, the present invention will be described in greater detail by referring to the accompanying drawing that illustrates preferred embodiment of the invention.

Figure 1:
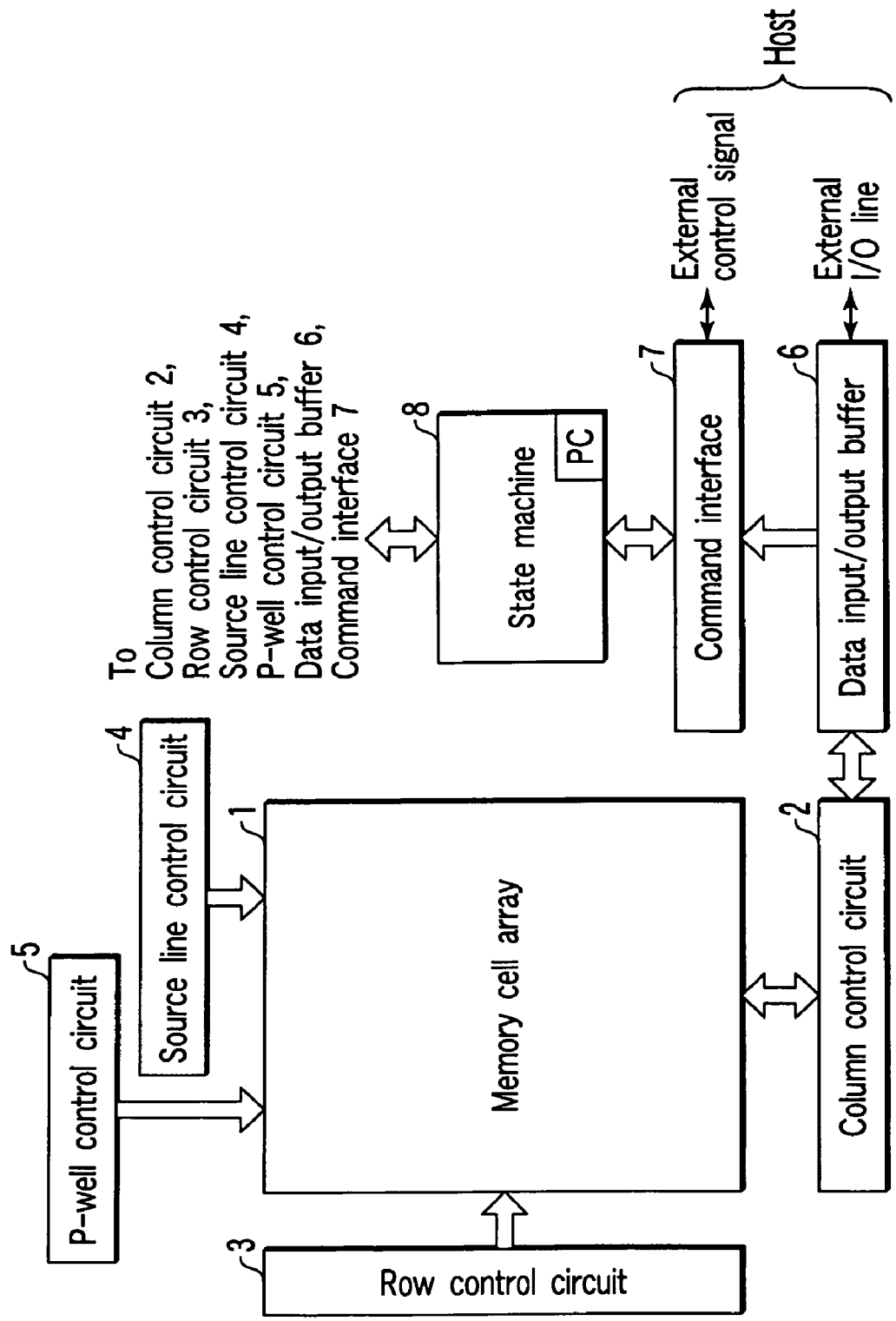
FIG. 1 is a schematic block diagram of the first embodiment of flash memory according to the invention, illustrating its overall configuration.

FIG. 1 is a schematic block diagram of the first embodiment of multi-value flash memory, illustrating its overall configuration. Referring to FIG. 1, a plurality of flash memory cells, a plurality of bit lines and a plurality of word lines are arranged in the memory cell array 1. The flash memory cells are arranged in the form of a matrix.

A column control circuit 2 and a row control circuit 3 are arranged adjacently relative to the memory cell array 1. The column control circuit 2 controls the bit lines in the memory cell array 1 for erasing data from, writing data into and reading data from memory cells.

The row control circuit 3 is used for selecting a word line in the memory cell array 1 and supplying a voltage necessary for erasing, writing and reading data.

Additionally, a source line control circuit 4 for controlling source lines of the memory cell array 1 and a P-well control circuit 5 for controlling a voltage of the p-type wells for forming the memory cell array 1 are also arranged near the memory cell array 1.

Data input/output buffer 6 is connected to a host by way of an external I/O line. The data input/output buffer 6 is adapted to receive data to be written, outputs read out data and receive address data and command data. The data to be written received by the data input/output buffer 6 are forwarded to the column control circuit 2. The data input/output buffer 6 receives the read out data from the column control circuit 2.

An external address data is sent to the column control circuit 2 and the row control circuit 3 by way of state machine 8 in order to select memory cells in the memory cell array 1.

A command data from the host is sent to command interface 7. The command interface 7 receives a control signal from the host and determines if the data input to the data input/output buffer 6 is a data to be written, a command data or an address data. If it is a command data, the command interface 7 forwards the command to the state machine 8 as received command signal.

The state machine 8 controls the overall operation of the flash memory. It receives a command from the host for controlling the operation of reading data, writing data and erasing data and also controls the data input/output operation. The state machine 8 arranged a write counter PC for counting the number of data writing operations to each of the memory cells.

Figure 2A:
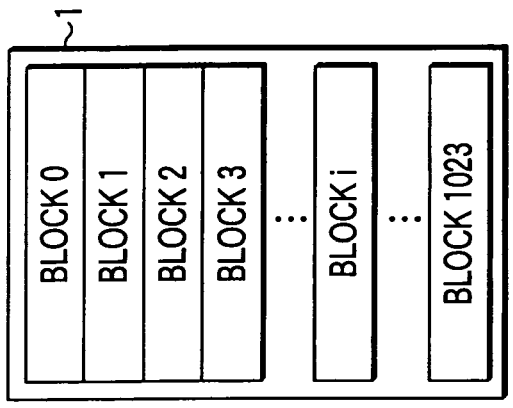
FIG. 2A is a schematic block diagram illustrating the internal configuration of the memory cell array in FIG. 1.
Figure 2B:
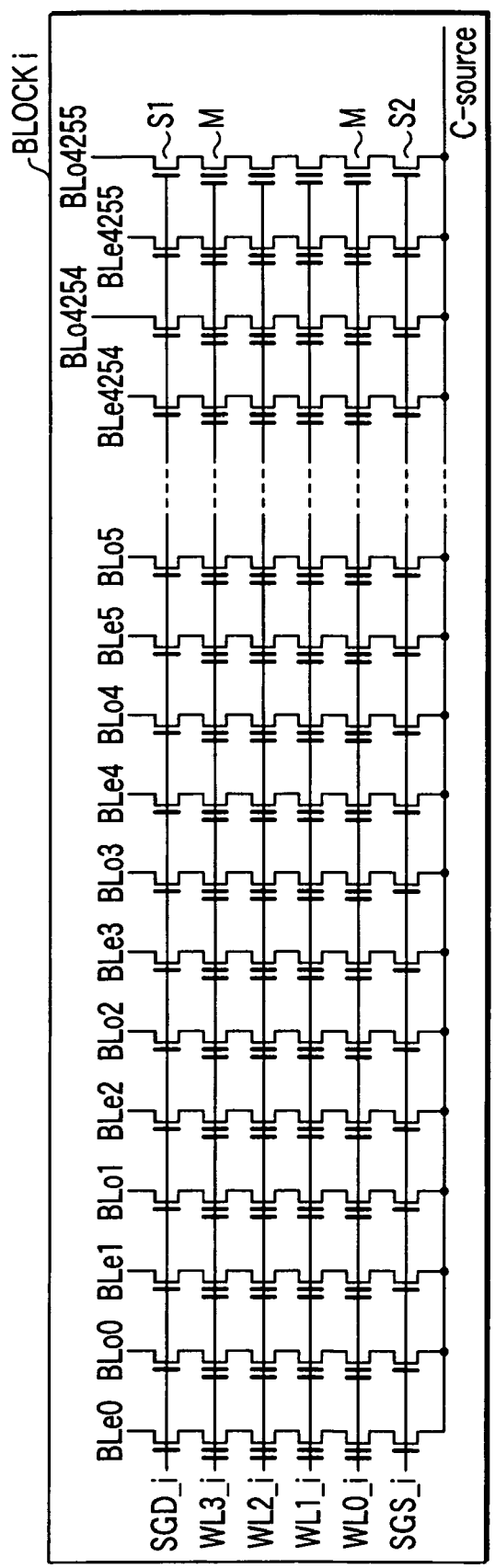
FIG. 2B is a circuit diagram of a NAND-type memory unit arranged in each of the blocks of FIG. 2A.

FIG. 2A is a schematic block diagram illustrating the internal configuration of the memory cell array 1 in FIG. 1. The memory cells of the memory cell array 1 are divided into a number of blocks BLOCK0 through BLOCK1023. A block is the smallest unit for an erasing operation. Each of the blocks BLOCKi (i=0 through 1023) includes a total of 8,512 NAND type memory units as shown in FIG. 2B.

In the first embodiment, each of the NAND type memory units contains four memory cells M that are connected in series and further to a bit line BLe or BLo at an end thereof by way of a selection gate S1 commonly connected to selection gate lines SGD i and to a common source line C-source at the opposite end thereof by way of a selection gate S2 commonly connected to selection gate lines SGS i.

Each memory cell M has a control gate, a floating gate, a source and a drain. The control gates of the four memory cell M of each NAND type memory unit are commonly connected to the corresponding one of the word lines WL0 i through WL3 i.

Data are independently written into and read out from the even-numbered bit lines BLe and the odd-numbered bit lines BLo as counted from 0. Data are simultaneously written into or read out from 4,256 memory cells connected to the even-numbered bit lines BLe out of the 8,512 memory cells whose control gates are connected to a single word line WL.

When each memory cell stores a 1-bit data, the 4,256 bits data stored in 4,256 memory cells constitute a unit of page. Thus, when a single memory cell stores a 2-bit data, the 4,256 memory cells store data of two pages. Data of other two pages are stored in the 4,256 memory cells connected to the odd-numbered bit lines BLo. Data are written into or read out from the memory cells of a same page simultaneously.

Figure 3:
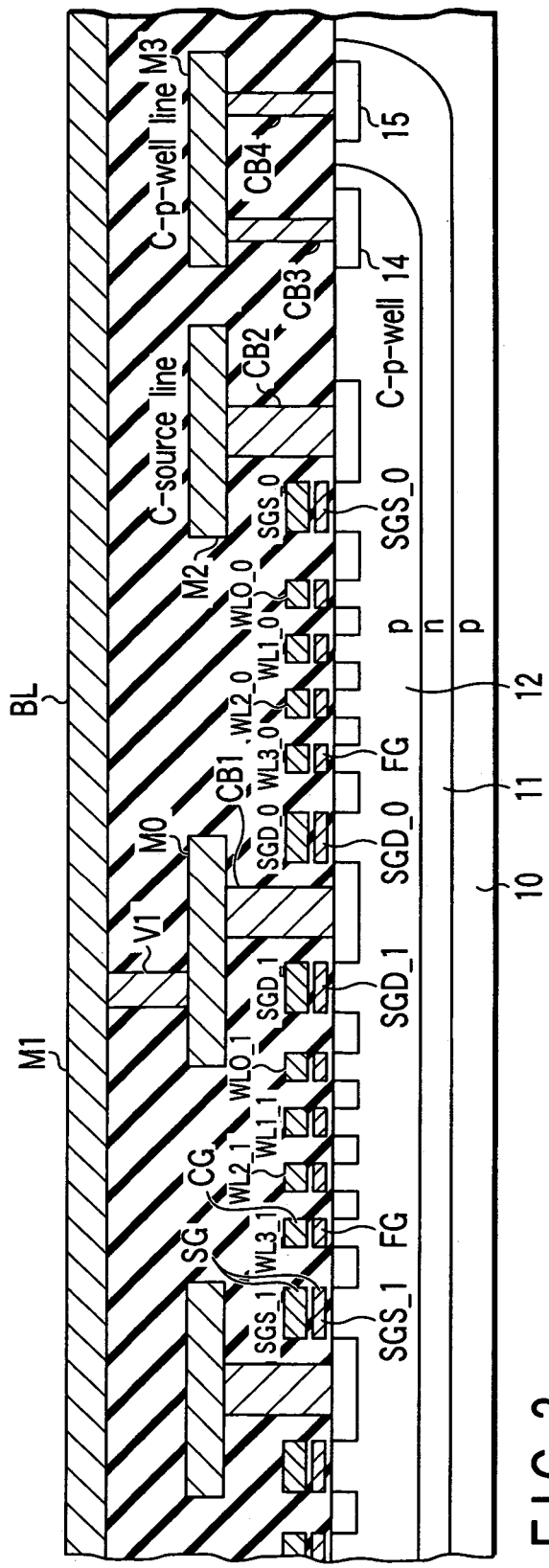
FIG. 3 is a schematic cross sectional view of the memory cell array of FIG. 1 taken along the column direction to show the structure of the device.

FIG. 3 is a schematic cross sectional view of the memory cell array 1 of FIG. 1 taken along the column direction to show the structure of the device. Referring to FIG. 3, an n-type well 11 is formed in a p-type substrate 10 and a p-type well 12 is formed in the n-type well 11. Each memory cell M comprises a source and a drain formed in an n-type diffusion layer 13, a floating gate FG arranged on a channel region between the source and the drain by way of a tunnel oxide film and a control gate CG arranged on the floating gate FG by way of an insulating film and operating as word line WL.

Each of the selection gates S1, S2 includes a source and a drain formed of the n-type diffusion layer 13 and a selection gate line SG having a two-layer structure. Both the word line WL and the selection gate line SG are connected to the row control circuit 3 in FIG. 1 and controlled by the output signal from the row control circuit 3.

Each NAND type memory unit including four memory cells M and selection gates S1, S2 is connected at an end thereof to the metal wiring layer M0 of the first layer by way of a contact hole CB1. The metal wiring layer M0 is connected to the metal wiring layer M1 of the second layer using as bit line BL by way of a via hole V1. The bit line BL is connected to the column control circuit 2 in FIG. 1.

The NAND type memory unit is connected at the other end thereof to the metal wiring layer M2 of the first layer using as common source line C-source by way of still another contact hole CB2. The common source line C-source is connected to the source line control circuit 4 in FIG. 1.

An n-type diffusion layer 14 is formed in the surface region of the n-type well 11, while a p-type diffusion layer 15 is formed in the surface region of the p-type well 12. Both of the n-type diffusion layer 14 and the p-type diffusion layer 15 are connected to the metal wiring layer M3 of the first layer using as well line C-p-well by way of respective contact holes CB3, CB4. The well line C-p-well is connected to the P well control circuit 5 in FIG. 1.

Figure 4A:
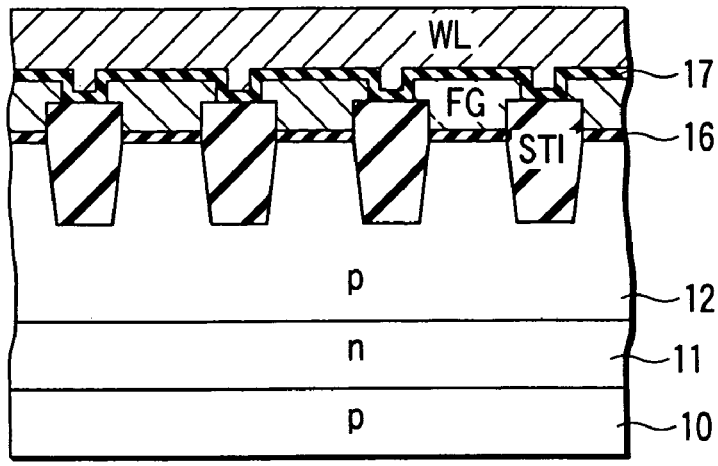
FIGS. 4A and 4B are schematic cross sectional views of the memory cell array of FIG. 1 taken along the row direction to show the structure of the device.
Figure 4B:
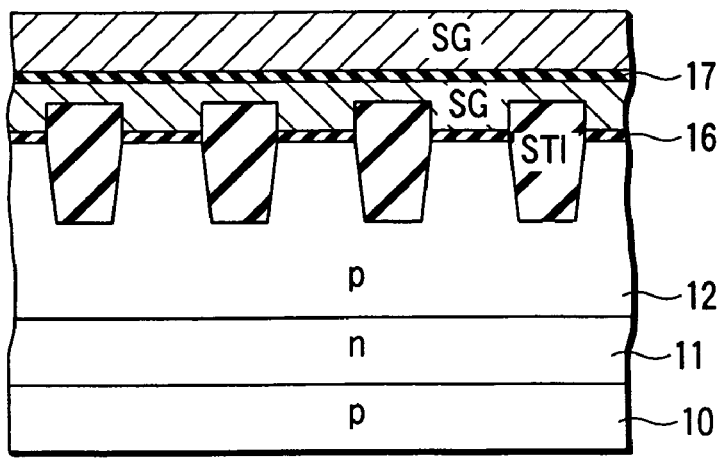

FIGS. 4A and 4B are schematic cross sectional views of the memory cell array 1 taken along the row direction to show the structure of the device. As shown in FIGS. 4A and 4B, each memory cell is isolated from the remaining memory cells by element isolations STI.

As shown in FIG. 4A, in each memory cell, the floating gate FG is laid on a channel region by way of a tunnel oxide film 16. A word line WL is laid on the floating gate FG by way of an insulating film 17 that is an ONO film.

As shown in FIG. 4B, the selection gate line SG has a two-layer structure. The upper layer selection gate line SG and the lower layer selection gate line SG are connected to an end of the memory cell array 1 or a predetermined number of bit lines.

Figure 5:
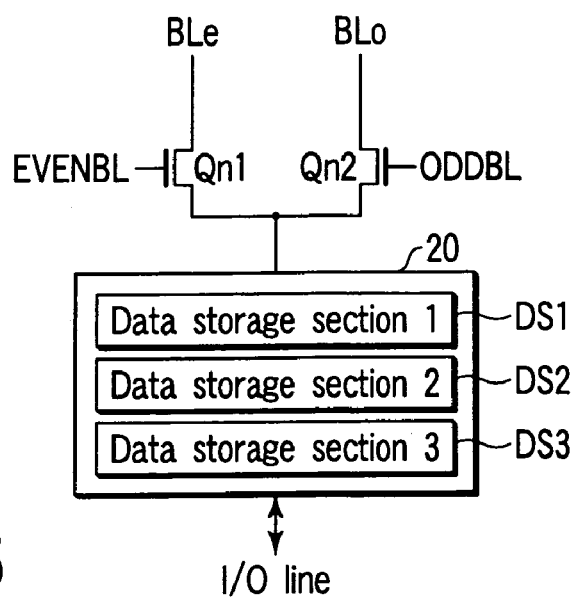
FIG. 5 is a schematic block diagram of a principal part of the column control circuit of FIG. 1, illustrating its configuration.

FIG. 5 is a schematic block diagram of a principal part of the column control circuit 2 of FIG. 1, illustrating its configuration. In the column control circuit 2, a data storage circuit 20 is arranged for every two bit lines including an even-numbered bit line BLe and an odd-numbered bit line BLo having a same column number. In the column control circuit 2, a sense amplifier is also arranged for the data storage circuit 20 in order to write data into and read data from memory cells.

Referring to FIG. 5, an n-channel MOS transistor Qn1 is connected for column selection between the data storage circuit 20 and the even-numbered bit line BLe, whereas another n-channel MOS transistor Qn2 is connected for column selection between the data storage circuit 20 and the odd-numbered bit line BLo.

Either of the even-numbered bit line BLe or the odd-numbered bit line BLo connected to each data storage circuit 20 is selected and connected to the data storage circuit 20 to control the operation of writing a data or that of reading a data. More specifically, when signal EVENBL is at level H and signal ODDBL is at level L, the MOS transistor Qn1 is made electrically conductive to select the even-numbered bit line BLe, which bit line BLe is then connected to the data storage circuit 20. When, on the other hand, when signal EVENBL is at level L and signal ODDBL is at level H, the MOS transistor Qn2 is made electrically conductive to select the odd-numbered bit line BLo, which bit line BLo is then connected to the data storage circuit 20. Note that the signal EVENBL is supplied to all the n-channel MOS transistors for column selection connected to the even-numbered bit lines BLe, whereas the signal ODDBL is supplied: to all the n-channel MOS transistors for column selection connected to the odd-numbered bit lines BLo. The unselected bit lines BL are controlled by some other circuit.

Each data storage circuit 20 includes three binary data storage sections DS1, DS2, DS3. The data storage section DS1 is connected to the data input/output buffer 6 by way of an internal data input/output line (I/O line) and stores an externally input data to be written or a read out data to be externally output. The data storage section DS2 stores the detection outcome of a write verify operation for confirming the threshold voltage of a memory cell after a write operation. The data storage section DS3 temporarily stores the data of a memory cell at the time of writing it and at the time of reading it.

Figure 6:
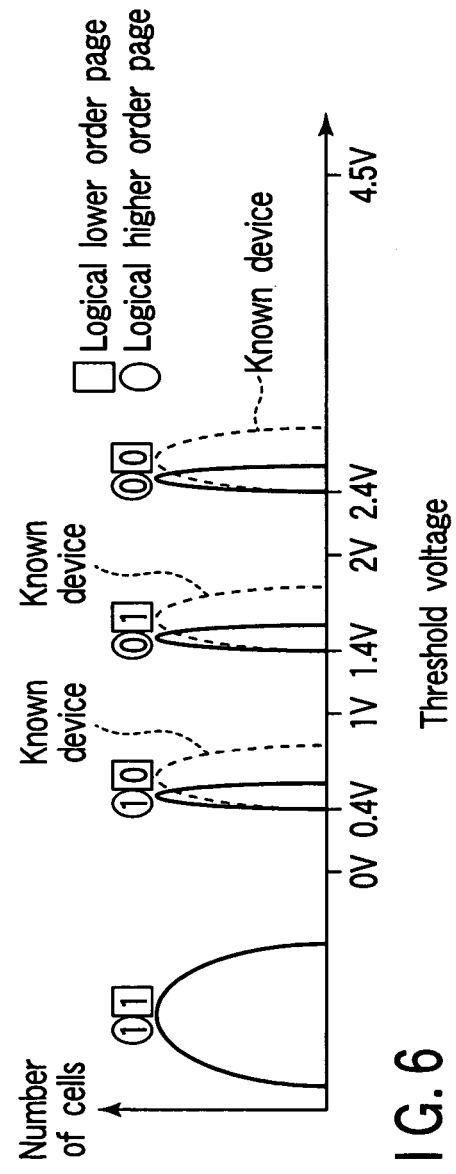
FIG. 6 is a graph illustrating the relationship between a multi-valued data and the threshold voltage of a memory cell of the first embodiment of multi-value flash memory according to the invention.

FIG. 6 is a graph illustrating the relationship between a multi-valued data and the threshold voltage of a memory cell of the first embodiment of multi-value flash memory.

Now, the operation of the first embodiment of multi-valued flash memory and having the above described configuration will be described below by referring to FIG. 6. Assume that each memory cell of the first embodiment is adapted to store two bits or a four-valued data. It will be appreciated that a 2-bit data is "11", "10", "01" or "00". The two bits belong respectively to different row addresses (different pages). The four-valued data is stored in a memory cell with different threshold voltages.

Referring to FIG. 6, assume that a data showing the lowest threshold voltage (e.g., the threshold voltage is negative) represents "11" and a data showing the second lowest threshold voltage (e.g., the threshold voltage is positive) represents "10", while a data showing the third lowest threshold voltage (e.g., the threshold voltage is positive) represents "01" and a data showing the highest threshold voltage (e.g., the threshold voltage is positive) represents "00".

After an erasing operation, the data in the memory cell is "11". If the data of the lower order page written into this memory cell is "0", the state of the memory cell shifts from "11" to "10" as a result of the writing operation. If the data written into this memory cell is "1", the state of the memory cell remains to be "11".

Then, the data of the higher order page is written into the memory cell. If the written data is "1", the state of the memory cell remain from "11" or "10". If the written data is "0", the state of the memory cell shift either from "11" to "01" or from "10" to "00".

During a write operation, the data written into a memory cell is read out and a so-called write verify operation is conducted to verify if the writing operation is satisfactory.

The data read out by the sense amplifier is regarded as "11" if the threshold voltage is not higher than 0V and as "10" if the threshold voltage is not lower than 0V and not higher than 1V, whereas the data is regarded as "01" if the threshold voltage is not lower than 1V and not higher than 2V and as "00" if the threshold voltage is not lower than 2V.

Table 1 shows typical voltages of various parts of the first embodiment of multi-valued flash memory in erase, write, read and write verify operations. Note that, the values shown in Table 1 are obtained when the word line WL2 and the even-numbered bit lines BLe are selected for write and read operations.

TABLE 1

|  | Erase | First step write | Second step write | Write inhibit | "10" read | "01" read | "00" read |
| --- | --- | --- | --- | --- | --- | --- | --- |
| BLe | Floating | 0 V | VBL | Vdd | H or L | H or L | H or L |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

|  | "10" first step write verify | "10" second step write verify | "01" first step write verify | "01" second step write verify | "00" first step write verify | "00" second step write verify |
| --- | --- | --- | --- | --- | --- | --- |
| BLe | H or L | H or L | H or L | H or L | H or L | H or L |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V |

For an erase operation, 20V and 0V are supplied respectively to the p-type well 12 (well line C-p-well) and all the word lines WL of the selected block. Electrons are discharged from the floating gates FG of all the memory cells M of the block so that the threshold voltage becomes negative to show a state of "11". While the word lines WL and the bit lines BL of the unselected blocks are brought to an electrically floating state, they show a voltage level close to 20V as a result of the capacitive coupling with the p-type well 12.

For writing a data, a first step write operation, a second step write operation and a write inhibiting operation are conducted sequentially. Firstly, program voltage (write voltage) Vpgm of about 14V to 20V is supplied to the selected word line WL2. A high voltage such as 10V is supplied to each of the unselected word lines, including, say, the word line WL3, of the memory cells located at the bit line side relative to the selected memory cells in order to make the memory cells connected to the word line WL3 electrically conductive. On the other hand, a low voltage such as 0V is supplied to each of the unselected word lines, including, say, the word line WL1, of the memory cells located at the side of the well line C-p-well relative to the selected memory cells in order make the memory cells connected to the word line WL1 electrically non-conductive. The selected bit lines BLe is supplies a voltage (write control voltage) such as 0V.

As a result, the 0V supplied to the selected bit lines BLe are transferred to the drains of the selected memory cells and the electric potential of the floating gates FG is raised by the capacitive coupling of the control gates CG and that of the floating gates FG so that electrons are injected into the floating gates FG from the drain by way of the tunnel oxide film (the tunnel oxide film 16 of FIG. 4A) due to the tunneling phenomenon and the threshold voltage is rapidly raised (the first step write operation). The voltage of the bit lines BLe is raised to 0.3V–0.4V, for example, to suppress the rate at which the threshold voltage rises in a write operation (the second step write-operation). The bit lines BLe are made to show a sufficiently high voltage, e.g., the supply voltage Vdd (up to 3V) for completely blocking the rise of the threshold voltage (write inhibition).

A read operation is conducted by sequentially supplying different read voltages (0V, 1V, 2V) to the selected word line WL2. A voltage that makes the unselected memory cells electrically conductive, typically 0.4.5V, is supplied to the unselected remaining word lines. If the threshold voltage of the selected memory cells is lower than the read voltage, the bit lines BLe and the common source line C-source are made electrically communicative with each other so that an electric current flows through them to bring the electric potential of the bit lines BLe to a relatively low level, or level L. If, on the other hand, the threshold voltage of the selected memory cells is higher the read voltage, the bit lines BLe and the common source line C-source are made electrically non-communicative with each other to bring the electric potential of the bit lines BLe to a relatively high level, or level H. The read voltage is typically made equal to 1V and a read operation is conducted (to read "10") for checking if the electric potential of a memory cell is higher than the threshold voltage corresponding to the state of "10" or not. The read voltage is typically made equal to 1V and a read operation is conducted (to read "01") for checking if the electric potential of a memory cell is higher than the threshold voltage corresponding to the state of "01" or not. The read voltage is typically made equal to 2V and a read operation is conducted (to read "00") for checking if the electric potential of a memory cell is higher than the threshold voltage corresponding to the state of "00" or not.

A data is written into a memory cell in the state of "10" so as to make the threshold voltage not smaller than 0.4V in order to provide a read margin of 0.4V for the read voltage of 0V. Thus, the operation of writing "10" is inhibited when the threshold voltage of the memory cell has got to 0.4V as a result of a write verify operation.

Conventional devices comparable to the first embodiment are only adapted to check if the threshold voltage has got to 0.4V or not so that the threshold voltage shows a relatively broad distribution width as indicated by the dot line in FIG. 6.

To the contrary, the first embodiment of the present invention is adapted to check if the threshold voltage has got to a level slightly lower than the target threshold voltage or not and the rate at which the threshold voltage rises is suppressed in the second step write operation. Therefore, it is now possible to narrow the distribution width of the threshold voltage as indicated by the solid line in FIG. 6. The above description also applies to the states of "01" and "00".

A write verify operation is conducted by sequentially supplying different verify voltages, e.g., 0.2V, 0.4V, 1.2V, 1.4V, 2.2V, 2.4V to the selected word line WL2. If the threshold voltage of the selected memory cells is lower than the verify voltage, the bit lines BLe and the common source line C-source are made electrically communicative with each other so that an electric current flows through them to bring the electric potential of the bit lines BLe to a relatively low level, or level L. If, on the other hand, the threshold voltage of the selected memory cells is higher than the verify voltage, the bit lines BLe and the common source line C-source are made electrically non-communicative with each other to bring the electric potential of the bit lines BLe to a relatively high level, or level H.

If the target threshold voltage of the memory cell is 0.4V, the verify voltage is reduced typically to 0.2V for a write verify operation in order to check if the threshold voltage of the memory cell is higher than a level slightly lower than the target threshold voltage, which is 0.2V in the first embodiment, or not (the first step operation of write verify "10"). The verify voltage is made equal to 0.4V and a write verify operation is conducted in order to check if the threshold voltage of the memory cell is higher than 0.4 or not (the second step operation of write verify "10").

If the target threshold voltage of the memory cell is 1.4V, the verify voltage is reduced typically to 1.2V for a write verify operation in order to check if the threshold voltage of the memory cell is higher than a level slightly lower than the target threshold voltage, which is 1.2V in the first embodiment, or not (the first step operation of write verify "01"). The verify voltage is made equal to 1.4V and a write verify operation is conducted in order- to check if the threshold voltage of the memory cell is higher than 1.4V or not (the second step operation of write verify "01")

If the target threshold voltage of the memory cell is 2.4V, the verify voltage is reduced to 2.2V for a write verify operation in order to check if the threshold voltage of the memory cell is higher than a level slightly lower than the target threshold voltage, which is 2.2V in the first embodiment, or not (the first step operation of write verify "00"). The verify voltage is made equal to 2.4V and a write verify operation is conducted in order to check if the threshold voltage of the memory cell is higher than 2.4 or not (the second step operation of write verify "00").

Note that the difference between the read voltage and the second verify voltage is made greater than the difference between the first verify voltage and the second verify voltage. For example, let us pay attention to a read "10" operation, the first step operation of write verify "10" and the second step operation of write verify "10". Since the voltage of the selected word line (WL2) at the time of the read "10" operation is 0V and the voltage of the selected word line at the time of the first step operation of write verify "10" is 0.2V, whereas the voltage of the selected word line at the time of the second step operation of write verify "10" is 0.4V as shown in table 1, the difference between the read voltage and the second verify voltage is 0.4V and the difference between the first verify voltage and the second verify voltage is 0.2V to prove that the difference between the read voltage and the second verify voltage is greater than the difference between the first verify voltage and the second verify voltage.

Figure 7:
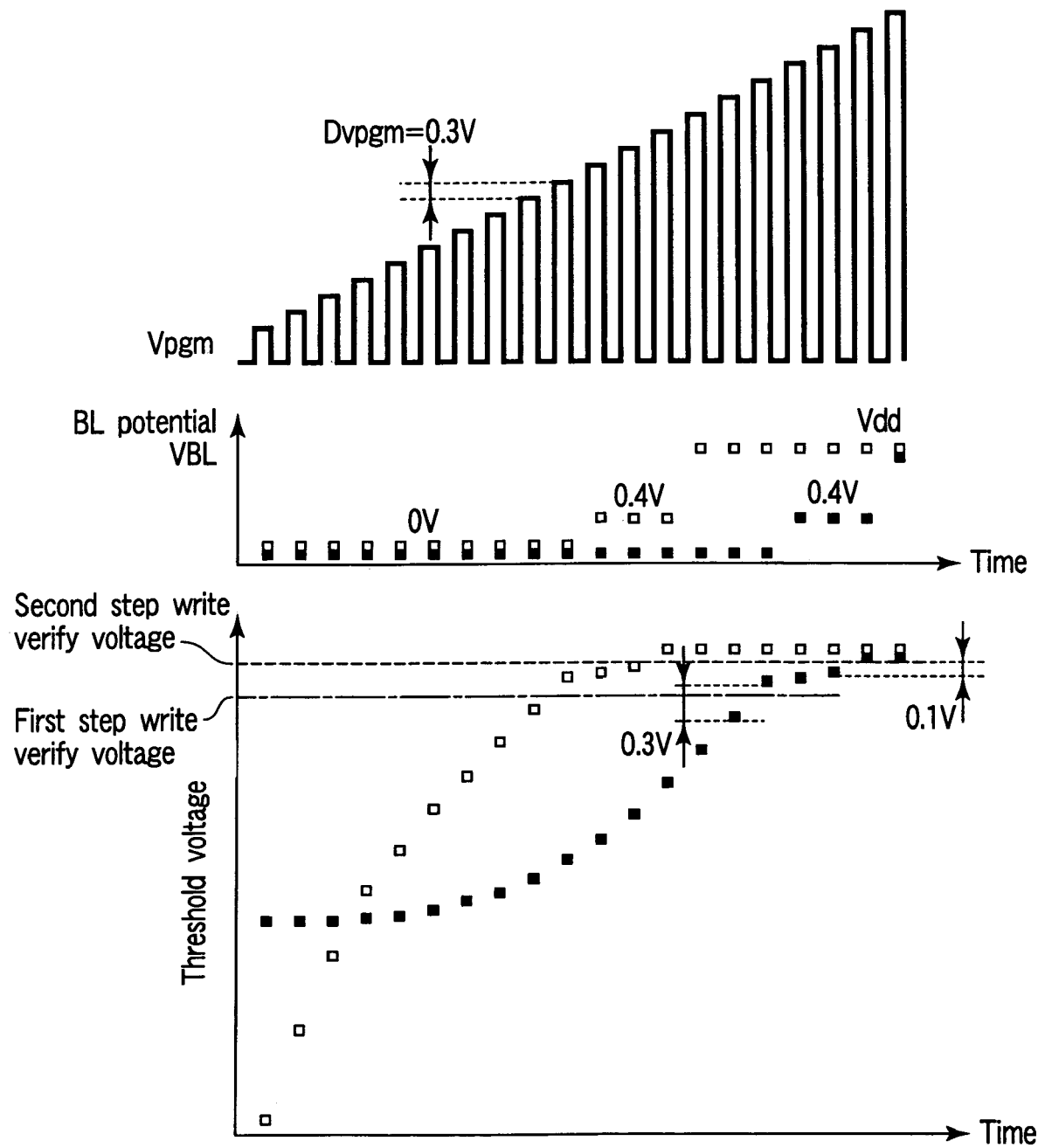
FIG. 7 is a graph illustrating the changing threshold voltage of memory cells of a known flash memory and a data writing method adapted to use such a changing threshold voltage.

FIG. 7 is a graph illustrating the changing threshold voltage of memory cells of a known flash memory and a data writing method adapted to use such a changing threshold voltage. This method is disclosed in Japanese Patent Laid Open (KOKAI) No. 2003-196988. In FIG. 7, the small white squares indicate the threshold voltage and the write control voltage (the voltage of the bit line BL) to be supplied to a memory cell where a data can be easily written, whereas the small black squares indicate the threshold voltage and the write control voltage (the voltage of the bit line BL) to be supplied to a memory cell where a data can be hardly written. The two memory cells stores the data of a same page. The data are erased from both of them in the initial state and they show a negative threshold voltage.

The write voltage Vpgm is divided into a number of pulses and the pulses are made to rise stepwise typically by 0.3V at a time. In other words, the write voltage Vpgm increased with a stepwise increment Dvpgm of 0.3V per pulse.

The voltage VBL of the bit line BL that is the write control voltage is made equal to 0V for the first step write operation. For the first step write operation, the threshold voltage is increased at a rate of 0.3V/pulse, which is equal to the increment of the write voltage Vpgm, after several pulses of the write voltage Vpgm. The first step write verify operation and the second step write verify operation are performed each time after applying the write pulse. The bit line voltage VBL of the bit line where it is detected that the threshold voltage has got to the first step write verify voltage is raised stepwise to 0.4V and the second step write operation is performed on a memory cell by memory bell basis. Furthermore, the bit line voltage VBL of the bit line where it is detected that the threshold voltage has got to the second step write verify voltage is made equal to Vdd and any write operation is prohibited on a memory cell by memory bell basis. Since the rate at which the threshold voltage rises is suppressed to between about 0V/pulse and 0.1V/pulse for several pulses after the start of the second step write operation, the threshold voltage has only a width of distribution of 0.1V.

Figure 8:
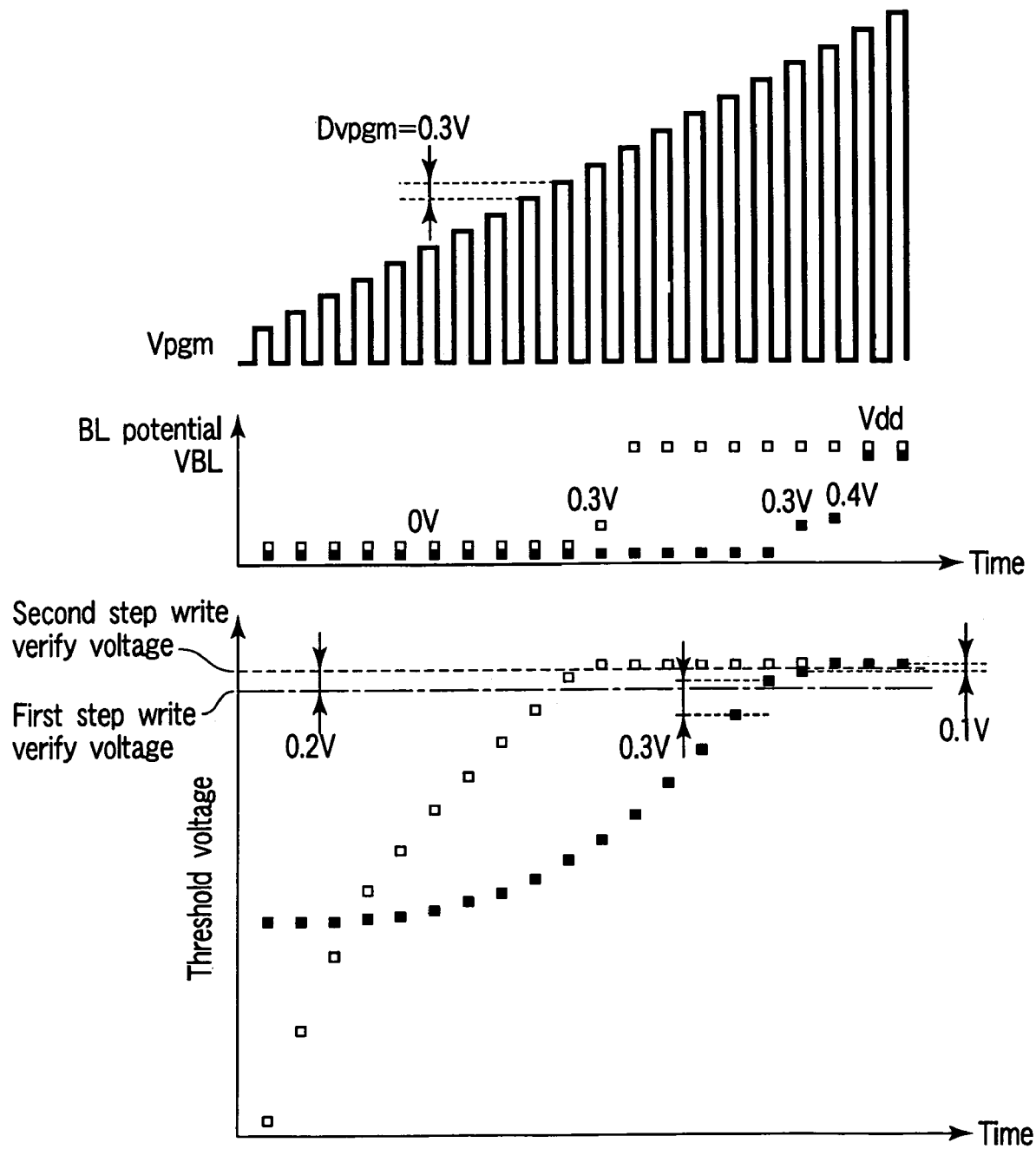
FIG. 8 is a graph illustrating the changing threshold voltage of a memory cell of the first embodiment of multi-value flash memory and a data writing method adapted to use such a changing threshold voltage.

FIG. 8 is a graph illustrating the changing threshold voltage of a memory cell of the first embodiment of multi-value flash memory and a data writing method adapted to use such a changing threshold voltage. As in the case of FIG. 7, the small white squares indicate the threshold voltage and the write control voltage (the voltage VBL of the bit line BL) to be supplied to a memory cell where a data can be easily written, whereas the small black squares indicate threshold voltages and a write control voltage (the voltage VBL of the bit line BL) to be supplied to a memory cell where a data can be hardly written. The two memory cells stores the data of the respective columns of a same page. The data are erased from both of them in the initial state and they show a negative threshold voltage.

The write voltage Vpgm is divided into a number of pulses and the pulses are made to rise stepwise typically by 0.3V at a time. In other words, the write voltage Vpgm increases with a stepwise increment Dvpgm of 0.3V per pulse.

The voltage VBL of the bit line BL that is the write control voltage is made equal to 0V and a first step write operation is conducted. In the first step write operation, the threshold voltage raises at a rate of 0.3V/pulse which is equal to the increment of the write voltage Vpgm after the supplied several pulses. A first step write verify operation or a second step write verify operation is conducted after the application of each write pulse.

The voltage of the bit line of the memory cell whose threshold voltage has got to the first step write verify voltage is subsequently increased from 0V to 0.3V and the second step write operation is conducted on a memory cell by memory cell basis. During the second step write operation, the bit line voltage VBL is incremented, for example, by 0.1V from 0.3V. The rate of increase of 0.3V of the write voltage Vpgm is greater than the rate of increase of 0.1V of the voltage of the bit line BL that is the write control voltage.

Therefore, the effective write voltage during the second step write operation keeps on increasing and the rate of increase is reduced to 0.2V.

As the first step write operation moves into the second step write operation, the bit line voltage VBL rises to 0.3V and the substantial write voltage falls so that the rate of increase of the threshold voltage of the memory cells is suppressed. Additionally, since the bit line voltage VBL raises stepwise from 0.3V at a rate of 0.1V during the second write operation, the rate of increase of the threshold voltage is continuously suppressed. Therefore, as compared with the case of FIG. 7, the threshold voltage of the memory cells during the second write operation can be controlled and held to a constant level so that the distribution width of the threshold voltage can be reduced accurately.

Besides, the bit line voltage VBL of the memory cell where the threshold voltage has reached the second step write verify voltage is made equal to Vdd and any write operation is prohibited on a memory-cell by memory cell basis. Since the rate of increase of the threshold voltage is suppressed to about 0.1V/pulse for several pulses after the start of the second step write operation, the distribution width of the threshold voltage is held as small as 0.1V.

In the case of FIG. 7, the second step write operation takes time immediately after the start thereof because the rising rate of the threshold voltage is unnecessarily suppressed. In the case of FIG. 8, to the contrary, the rate of increase of the bit line voltage VBL immediately after the start of the second step write operation is made equal to 0.3V, which is smaller than 0.4V of FIG. 7, and, as the second step write operation proceeds, the bit line voltage VBL that has been raised to 0.3V is increased stepwise by 0.1V. With this arrangement, the rate of increase of the threshold voltage is not unnecessarily suppressed and hence it is possible to reduce the time necessary for the write operation if compared with the case of FIG. 7.

The operation of writing "10" is performed as the first step write verify voltage is made equal to the "10" first step write verify voltage and the second step write verify voltage is made equal to the "10" second step write verify voltage.

The write operation is prohibited when the bit line voltage VBL has been raised by three steps after the start of the second step write operation, or when a predetermined period of time has elapsed since the start of the second step write operation.

In the first and second step write operations, the write voltage Vpgm is made to change so as to increase stepwise by 0.3V as shown in FIG. 8. It will be appreciated that the rate of increase of the write voltage Vpgm, which is equal to 0.3V, is greater than the difference between the first step write verify voltage and the second step write verify voltage, which is equal to 0.2V.

Figure 9:
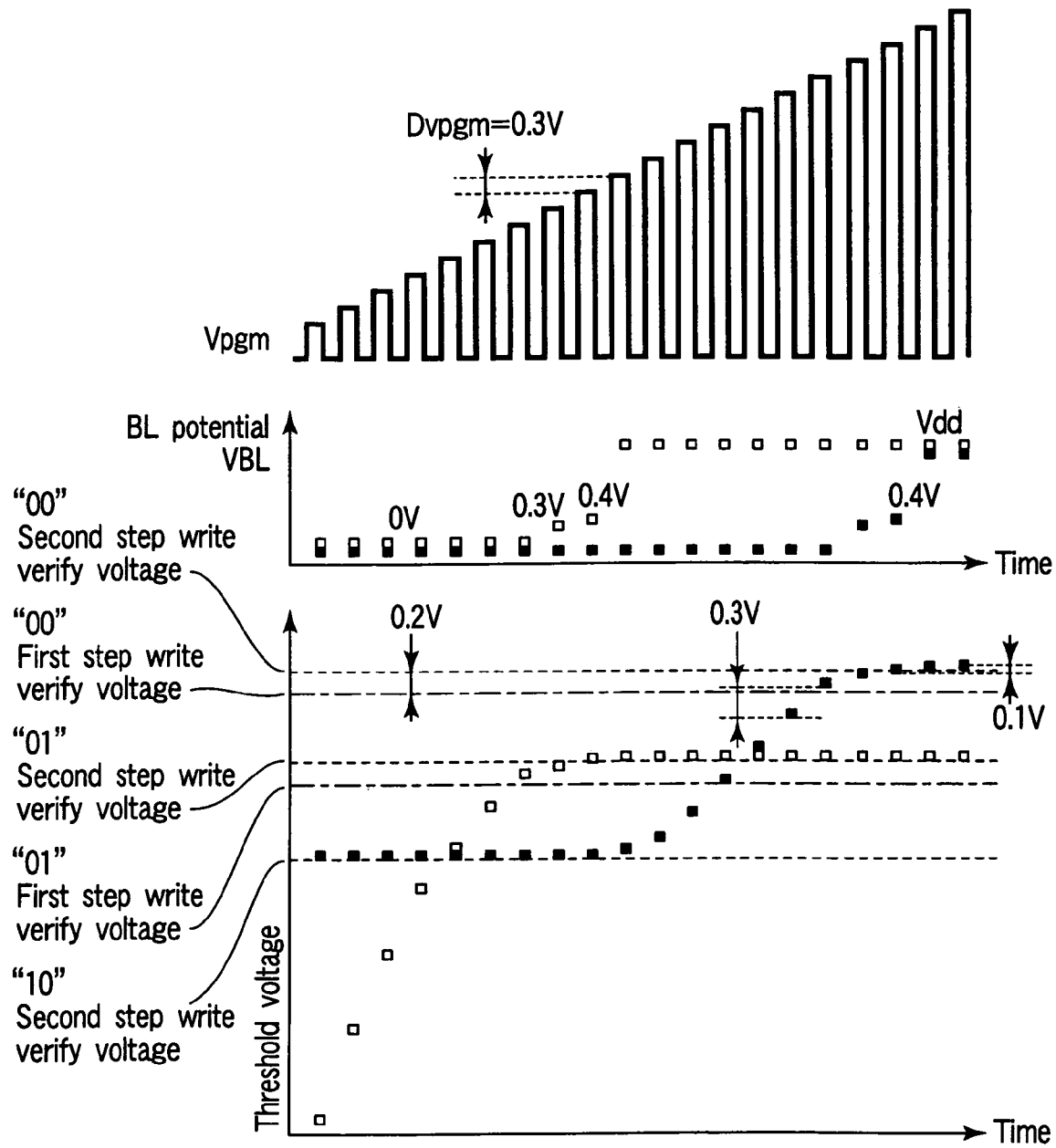
FIG. 9 is a graph illustrating the method for writing a higher order page data into a same memory cell and the change with time of the threshold voltage of the memory of the first embodiment.

FIG. 9 is a graph illustrating the method for writing a higher order page data into a same memory cell and the change with time of the threshold voltage of the memory of the first embodiment. As in the case of FIGS. 7 and 8, the small white squares indicate the threshold voltage and the write control voltage (the voltage VBL of the bit line BL) to be supplied to a memory cell where a data can be easily written, whereas the small black squares indicate threshold voltages and a write control voltage (the voltage VBL of the bit line BL) to be supplied to a memory cell where a data can be hardly written. The two memory cells stores the data of the respective columns of a same page.

The data in the memory cell whose write control voltage is indicated by white squares, where a data can be easily written, is erased in the initial state and the memory cell shows a negative-threshold voltage. Assume that a date is written in the memory cell to make it show to show a "01" state. A data is already written in the memory cell whose write control voltage is indicated by black squares to make it show a "10" state in the initial state. Assume that a data is written to the memory cell to make it show a "00" state.

The write voltage Vpgm is divided into a number of pulses and the pulses are made to rise stepwise typically by 0.3V at a time. In other words, the write voltage Vpgm increases with a stepwise increment Dvpgm of 0.3V per pulse. The voltage VBL of the bit line BL that is the write control voltage is made equal to 0V and a first step write operation is conducted. In the first step write operation, the threshold voltage rises at a rate of 0.3V/pulse which is equal to the increment of the write voltage Vpgm after several pulses. A "01" first step write verify operation and a "01" second step write verify operation are conducted after the application of each write pulse. Thereafter, a "00" first step write verify operation and a "00" second step write verify operation are conducted.

When the threshold voltage of the memory cell indicated by white squares is detected to have got to the "01" first step write verify voltage, subsequently the bit line voltage VBL is made equal to 0.3V and the process proceeds to the second step write operation. During the second step write operation, for example, the bit line voltage VBL increases with a stepwise increment 0.1V. When the threshold voltage of the memory cell indicated by black squared is detected to have got to the "00" first step write verify voltage, subsequently the bit line voltage VBL is made equal to 0.3V and the process proceeds to the second step write operation. During the second step write operation, for example, the bit line voltage VBL increases with a stepwise increment 0.1V.

Furthermore, when the threshold voltage of the memory cell indicated by white squares is detected to have got to the "01" second step write verify voltage, subsequently the bit line voltage VBL is made equal to Vdd and the write operation is inhibited. Finally, when the threshold voltage of the memory cell indicated by black squares is detected to have got to the "00" second step write verify voltage, subsequently the bit line voltage VBL is made equal to Vdd and the write operation is inhibited.

For both data "01" and data "00", the rate of increase of the threshold voltage is suppressed to about 0.1V/pulse for several pulses of the write voltage, 2 pulses in this example, after the start of the second step write operation and hence the threshold voltage has a distribution width of only 0.1V. In other words, the distribution width of the threshold voltage can be reduced accurately.

Figure 10:
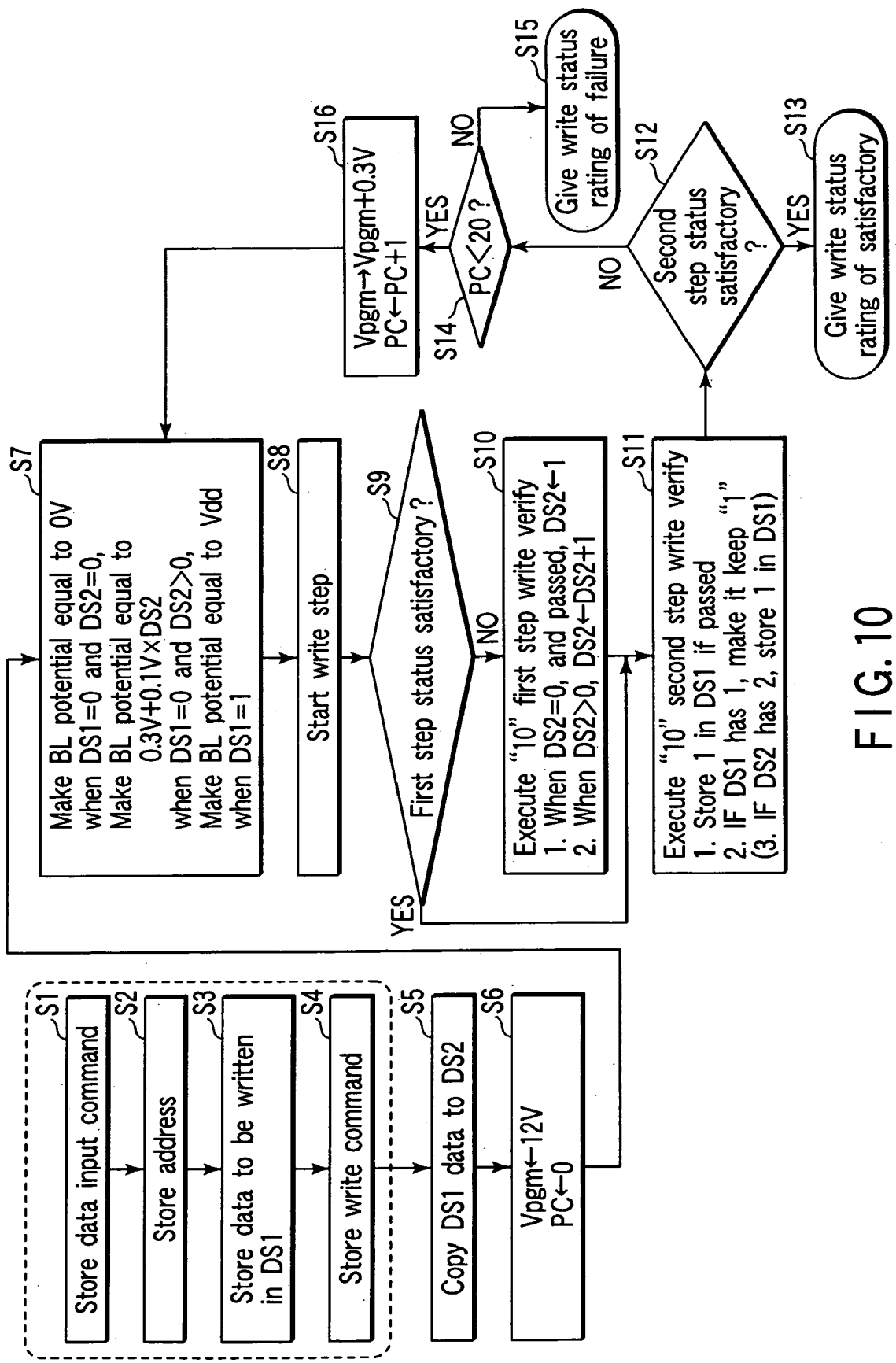
FIG. 10 is a flow chart schematically illustrating the control algorithm of the first embodiment of flash memory when writing a lower order page data into a single memory cell.

FIG. 10 is a flow chart schematically illustrating the control algorithm of the first embodiment of flash memory when writing a lower order page data-into a single memory cell. The control operation starts with receiving a data input command from the host and placing the data input command in the state machine 8 (S1). Then, the operation proceeds to receiving an address data from the host and placing the address in the state machine 8 to select the page to be used for a write operation (S2). Thereafter, the operation proceeds to a step of receiving data to be written in a page and storing them correspondingly in the respective data storage sections DS1 (S3). Subsequently, the operation proceeds to a step of receiving a write command issued from the host and placing the write command in the state-machine 8 (S4). As the write command is placed, the operation of Steps S5 through S16 is automatically started by the state machine 8 in the inside.

The data stored in the data storage sections DS1 are copied respectively to the corresponding data storage sections DS2 (S5). Thereafter, 12V is selected for the initial value of the write voltage Vpgm and the write counter PC is set to 0 (S6). If the data in the data storage sections DS1 are "0"s and the data in the data storage sections DS2 are also "0"s, they indicate a first step write operation and, therefore, the voltage of the bit lines BLe that is the write control voltage is reduced to 0V. If, on the other hand, the data in the data storage sections DS1 are "0"s and the data in the data storage sections DS2 are not lower than "0"s (DS2>0), they indicate a second step write operation and, therefore, the voltage of the bit lines BLe that is the write control voltage is brought to (0.3V+0.1V*DS2). If, finally, the data in the data storage sections DS1 are "1"s, they indicate write inhibition and, therefore, the voltage of the bit lines BLe that is the write control voltage is brought to Vdd (S7).

Then, the operation proceeds to the write step of applying a write pulse to the memory cells for storing the data of a page by using the selected write voltage Vpgm and the write control voltage VBL (S8). In the next step, if all the data stored in the data storage sections DS2 are "1"s or not is checked and, if they are all "1"s, it is determined that the status of the first step is satisfactory whereas, if all the data stored in the data storage sections DS2 are not "1"s, it is determined that the status of the first step is not satisfactory (S9). As will be described hereinafter, if all the data stored in the data storage sections DS2 are not lower than "0"s, there is no memory cell where the first step write operation is conducted in the preceding write step (S8).

When the status of the first step is not satisfactory, a "10" first step write verify operation is started (Step S10) and the data of the data storage sections DS2 corresponding to only the memory cells where the detection outcome is satisfactory out of the memory cells for storing the data of a page are shifted from "0"s to "1"s. 1 is added to the value of DS2 for the data storage sections DS2 that store data not smaller than 1 (DS2>0). For example, if the value of DS2 is equal to 1, it is made equal to 2 by adding 1.

When the status of the first step is satisfactory or when the "10" first step write verify operation is completed, a "10" second step write verify operation is started (S11). The data of the data storage sections DS1 corresponding to only the memory cells where the detection outcome is satisfactory out of the memory cells for storing the data of a page are shifted from "0"s to "1"s. The data storage sections DS1 storing "1"s are made to keep on storing "1"s.

The data of the data storage sections DS1 may forcibly be made equal to 1 if the data in the data storage sections DS1 are equal to 2. Then, the second step write operation is always repeated twice before it ends. This is because the second step write verify operation may probably be satisfactory in the example of FIG. 8 if the threshold voltage of the memory cells is raised stepwise by 0.1V at a time during the second step write operation. This arrangement is provided in order to prevent that the second step write operation is repeated further to prolong the total time period of the overall write operation when the second step write verify voltage is only slightly lower than the required level.

After the "10" second step write verify operation, if all the data stored in the data storage sections DS1 are "1"s or not is checked and, if they are all "1"s, it is determined that the status of the second step is satisfactory whereas, if all the data stored in the data storage sections DS2 are not "1"s, it is determined that the status of the second step is not satisfactory (S12). If the status of the second step is satisfactory, it is judged that the write operation has completed successfully and the status of the write operation is rated as satisfactory to terminate the write operation (S13).

If, on the other hand, the status of the second step is not satisfactory, the write counter PC is checked (S14). If the reading of the write counter PC is not less than 20, it is judged that the status of the write operation is failure and the write operation is terminated unsuccessfully (S15). If the reading of the write counter PC is not greater than 20, the reading of the write counter PC is incremented by one and the write voltage Vpgm is raised by 0.3V (S16). Then, the operation is moved back to Step S7 and then the write operation of Step S8 is retried. It will be appreciated that the norm for the write operation is not necessarily be 20 and some other norm may be selected if appropriate.

Figure 11:
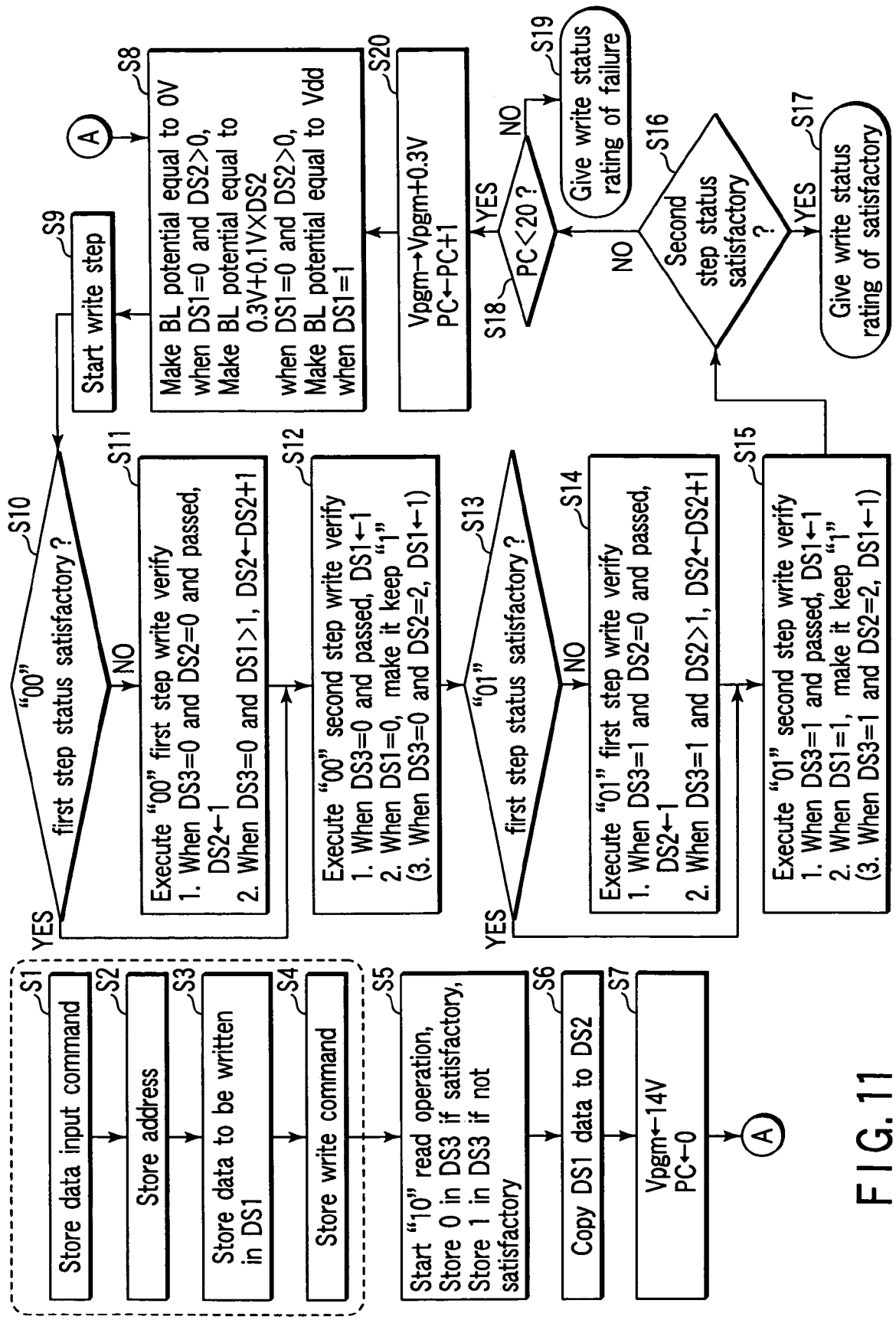
FIG. 11 is a flow chart schematically illustrating the control algorithm of the first embodiment of flash memory when writing a higher order page data into a memory cell.

FIG. 11 is a flow chart schematically illustrating the control algorithm of the first embodiment of flash memory when writing a higher order page data into a memory cell.

Referring to FIG. 11, the control operation starts with receiving a data input command from the host and placing the data input command in the state machine 8 (S1). Then, the operation proceeds to receiving an address data from the host and placing the address in the state machine 8 to select the page to be used for a write operation (S2). Thereafter, the operation proceeds to a step of receiving data to be written in a page and storing them correspondingly in the respective data storage sections DS1 (S3). Subsequently, the operation proceeds to a step of receiving a write command issued from the host and placing the write command in the state machine 8 (S4). As the write command is placed, the operation of Steps S5 through S20 is automatically started by the state machine 8 in the inside.

Firstly, a "10" read operation is started (S5). If the operation is satisfactory (the data of the memory cells are "10"s), "0"s are stored in the corresponding data storage sections DS3. If the operation is not satisfactory, "1" are stored in the corresponding data storage sections DS3. Thereafter, the data stored in the data storage sections DS1 are copied respectively to the corresponding storage sections DS2 (S6). Then, 14V is selected for the initial value of the write voltage Vpgm and the write counter PC is set to 0 (S7). If the data in the data storage sections DS1 are "0"s and the data in the data storage sections DS2 are also "0"s, they indicate a first step write operation and, therefore, the voltage VBL of the bit lines BL that is the write control voltage is set to 0V. If, on the other hand, the data in the data storage sections DS1 are "0"s and the data in the data storage sections DS2 are not lower than "0"s, they indicate a second step write operation and, therefore, the voltage VBL of the bit lines BL that is the write control voltage is set to (0.3V+0.1V*DS2). If, finally, the data in the data storage sections DS1 are "1"s and the data in the data storage sections DS2 are also "1"s, they indicate write inhibition and, therefore, the voltage of the bit lines BL that is the write control voltage is set to Vdd (S8). Then, the operation proceeds to the write step of applying a write pulse to the memory cells for storing the data of a page by using the selected write voltage Vpgm and the write control voltage (S9).

In the next step, in all the data storage circuits 20 where "0"s are stored in the data storage sections DS3, it is checked if all the data stored in the data storage sections DS2 are "1"s and more or not and, if they are all "1"s and more, it is determined that the status of the "00" first step is satisfactory whereas, if all the data stored in the data storage sections DS2 are not "1"s and more, it is determined that the status of the "00" first step is not satisfactory (S10). As will be described hereinafter, if all the data stored in the data storage sections DS2 are "1"s and more, there is no memory cell where the "00" first step write operation is conducted in the preceding write step (S9).

If the status of the "00" first step is not satisfactory, a "00" first step write verify operation is executed (S11) and the data of the data storage sections DS2 corresponding to only the memory cells where the detection outcome is satisfactory out of the memory cells for storing the data of a page are shifted from "0"s to "1"s, provided that the data in the data storage sections DS3 are "0". 1 is added to the value of DS2 for the data storage sections DS2 that store data not smaller than 1. For example, if the value of DS2 is equal to 1, it is made equal to 2 by adding 1.

When the status of the "00" first step is satisfactory or when the "00" first step write verify operation is completed, a "00" second step write verify operation is started (S12). The data of the data storage sections DS1 corresponding to only the memory cells where the detection outcome is satisfactory out of the memory cells for storing the data of a page are shifted from "0"s to "1"s, provided that the data in the data storage section DS3 are "0"s. The data of the data storage sections DS1 may forcibly be made equal to 1 if the data in the data storage sections DS3 are equal to 0 and the data in the data storage sections DS2 are equal to 2. Then, the second step write operation is always repeated twice before it ends. In other words, the second step write operation ends after the elapse of a predetermined period of time. This is because the second step write verify operation may probably be satisfactory after the second write operation in the example of FIG. 9 if the threshold voltage of the memory cells is raised stepwise by 0.1V at a time during the second step write operation. This arrangement is provided in order to prevent that the second step write operation is repeated further to prolong the total time period of the overall write operation when the second step write verify voltage is only slightly lower than the required level.

Thereafter, in all the data storage circuits 20 where "1"s are stored in the data storage sections DS3, it is checked if all the data stored in the data storage sections DS2 are "1"s and more or not is checked, if they are all "1"s and more, it is determined that the status of the "01" first step is satisfactory whereas, if all the data stored in the data storage sections DS2 are not "1"s and more, it is determined that the status of that step is not satisfactory (S13). As will be described hereinafter, if all the data stored in the data storage sections DS2 are "1"s, there is no memory cell where the first step write operation is conducted in the preceding write step (S9).

If the status of the "01" first step is not satisfactory, a "01" first step write verify operation is executed (S14) and, in all the data storage circuits 20 where "1"s are stored in the data storage sections DS3, the data of the data storage sections DS2 corresponding to only the memory cells where the detection outcome is satisfactory out of the memory cells for storing the data of a page are shifted from "0"s to "1"s. The data storage sections DS2 storing "1"s are made to keep on storing "1"s. 1 is added to the value of DS2 (DS2←DS2+1) for the data storage sections DS3 that store data equal to 1 and the data storage sections DS2 that store data not smaller than 1 (DS2>1). For example, if the value of DS2 is equal to 1, it is made equal to 2 by adding 1.

When the status of the "01"first step is satisfactory or when the "01" first step write verify operation is completed, a "10" second step write verify operation is started (S15). Then, in all the data storage circuits 20 where "1"s are stored in the data storage sections DS3, the data of the data storage sections DS1 corresponding to only the memory cells where the detection outcome is satisfactory out of the memory cells for storing the data of a page are shifted from "0"s to "1". The data of the data storage sections DS1 may forcibly be made equal to 1 if the data in the data storage sections DS3 are equal to 1 and the data in the data storage sections DS2 are equal to 2. Then, the second step write operation is always repeated twice before it ends. In other words, the second step write operation ends after the elapse of a predetermined period of time. This is because the second step write verify operation may probably be satisfactory after the second write operation in the example of FIG. 9 if the threshold voltage of the memory cells is raised stepwise by 0.1V at a time during the second step write operation. This arrangement is provided in order to prevent that the second step write operation is repeated further to prolong the total time period of the overall write operation when the second step write verify voltage is only slightly lower than the required level.

After the "01" second step write verify operation, if all the data stored in the data storage sections DS1 are "1"s or not is checked and, if they are all "1"s, it is determined that the status of the second step is satisfactory whereas, if all the data are not "1"s, it is determined that the status of the second step is not satisfactory (S16). If the status of the second step is satisfactory, it is judged that the write operation has completed successfully and the status of the write operation is rated as satisfactory to terminate the write operation (S17). If, on the other hand, the status of the second step is not satisfactory, the write counter PC is checked (S18). If the reading of the write counter PC is not less than 20, it is judged that the status of the write operation is failure and the write operation is terminated unsuccessfully (S19). If the reading of the write counter PC is not greater than 20, the reading of the write counter PC is incremented by one and the write voltage Vpgm is raised by 0.3V (S20). Then, the operation is moved back to Step S8 and then the write operation of Step S9 is retried. It will be appreciated that the norm for the write operation is not necessarily be 20 and some other norm may be selected if appropriate.

Figure 12:
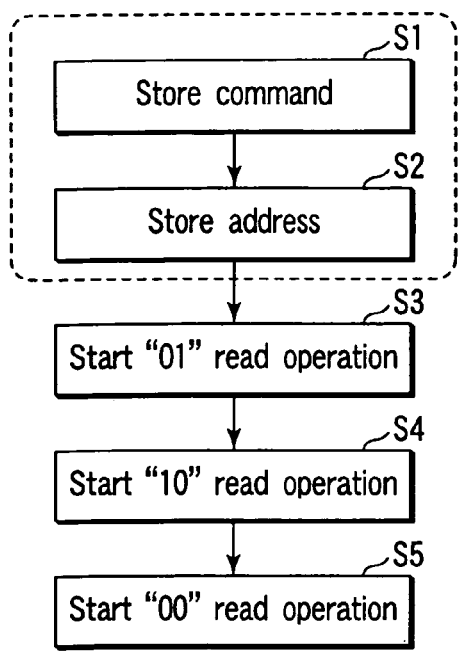
FIG. 12 is a flow chart schematically illustrating the control algorithm of the first embodiment of flash memory when reading the lower order page data stored in a memory cell.

FIG. 12 is a flow chart schematically illustrating the control algorithm of the first embodiment of flash memory when reading the lower order page data stored in a memory cell. The control operation starts with receiving a read command from the host and placing the read command in the state machine 8 (S1). Then, the operation proceeds to receiving an address data from the host and placing the address in the state machine 8 to select the page to be used for a read operation (S2). As a result of the addressing, the operation of Steps S3 through S5 is automatically started by the state machine 8 in the inside.

Firstly, a "01" read operation is started (S3). If the threshold voltage of the memory cell is lower than the "01" data, "1" is produced by the reading operation of the sense amplifier. Whereas, if the threshold voltage of the memory cell is higher than the "01" data, "0" is produced by the reading operation of the sense amplifier. The outcome of the read operation is stored in the corresponding data storage section DS3. Thereafter, a "10" read operation is started (S4). If the threshold voltage of the memory cell is lower than the "10" data, "1" is produced by the reading operation of the sense amplifier. Whereas, if the threshold voltage of the memory cell is higher than the "10" data, "0" is produced by the reading operation of the sense amplifier. The outcome of the read operation is stored in the corresponding data storage section DS2. Lastly, a "00" read operation is started (S5). If the threshold voltage of the memory cell is lower than the "00" data, "1" is produced by the reading operation of the sense amplifier whereas, if the threshold voltage of the memory cell is higher than the "00" data, "0" is produced by the reading operation of the sense amplifier. The lower order page data is produced by a logical operation using the outcome of the "00" read operation and the data stored in the corresponding data storage sections DS2 and DS3 and stored in the corresponding data storage section DS1. The data stored in the data storage section DS1 is output as lower order page data.

Figure 13:
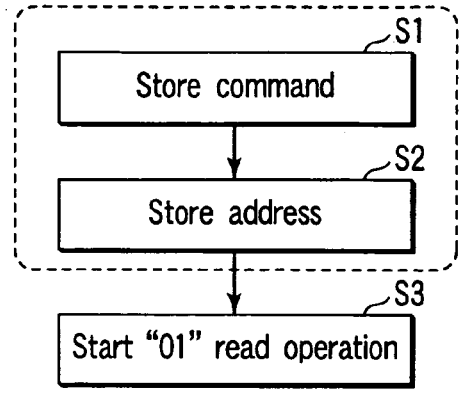
FIG. 13 is a flow chart schematically illustrating the control algorithm of the first embodiment of flash memory when reading the higher order page data stored in a memory cell.

FIG. 13 is a flow chart schematically illustrating the control algorithm of the first embodiment of flash memory when reading the higher order page data stored in a memory cell. The control operation starts with receiving a read command from the host and placing the read command in the state machine 8 (S1). Then, the operation proceeds to receiving an address data from the host and placing the address in the state machine 8 to select the page to be used for a read operation (S2). As a result of the addressing, the operation of Step S3 is automatically started by the state machine 8 in the inside.

A "01" read operation is started in Step S3. The outcome of the reading operation shows upper order page data, which is stored in the corresponding data storage section DS1. In other words, the outcome of the operation of reading "01" is used as upper order page data. Then, the data in the data storage section DS1 is externally output.

In this way, with the multi-value flash memory of the first embodiment, it is now possible to suppress any undesired increase of write time and reduce the distribution width of the threshold voltage so as to improve the reliability of the device.

Now, the second embodiment of the present invention will be described below.

Figure 14:
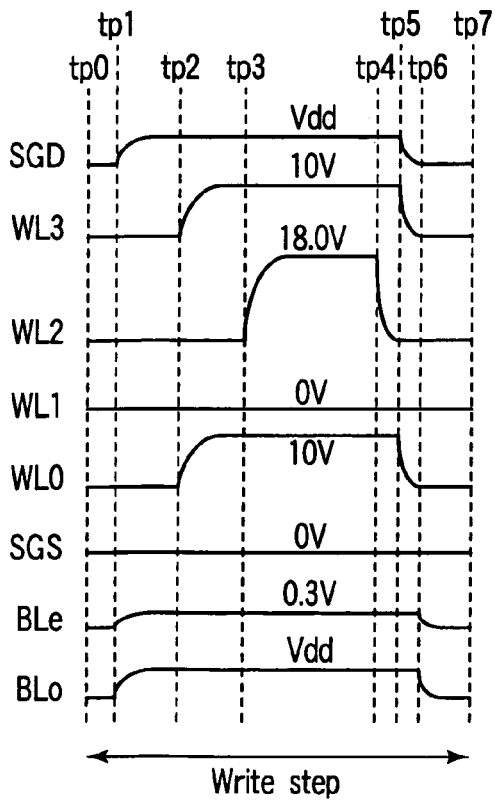
FIG. 14 is a graph illustrating the signal waveforms in a write step of the first embodiment of flash memory.

FIG. 14 is a graph illustrating the signal waveforms in a write step of the first embodiment of flash memory. The voltage of bit line BLe is made equal to 0.3V immediately after a write operation for the second step write operation. In a write step of the first embodiment, the voltage of bit line BLe, which is the write-control voltage, is raised stepwise from 0.3V by 0.1V at a time for a write operation while a predetermined write voltage (18.0V in the illustrated example) is being applied to word line WL (WL2).

Figure 15:
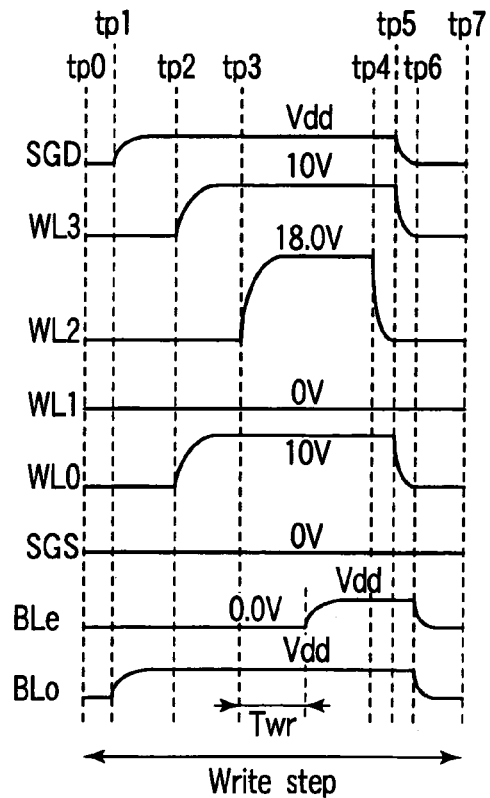
FIG. 15 is a graph illustrating the signal waveforms in a write step of the second embodiment of flash memory.

To the contrary, in the second embodiment, the voltage (VBL) of the bit line BLe, which is the write control voltage, is not raised to 0.3V immediately after the start of the second step write operation but, as shown in FIG. 15, the voltage of the bit line BLe, which is the write control voltage, is made equal to 0V for a predetermined period of time (Twr in FIG. 15) out of the time period during which the write voltage Vpgm is being applied to the selected word line WL2 and subsequently it is made equal to Vdd in order to prohibit any write operation. With this arrangement, the effective write pulse width is reduced to suppress the increase of the threshold voltage. Thus, the net effect is similar to that of the arrangement where the bit line voltage VBL (the voltage of the bit line BLe in this embodiment), which is the write control voltage, is made equal to 0.3V. The effective bit line voltage (effective voltage) is determined by for what period of time the voltage of the bit line is made equal to 0V while the write voltage Vpgm is being applied to the selected word line WL2. It is possible to made the effective bit line voltage equal to 0.3V when the period of time is prolonged.

In short, this embodiment of non-volatile semiconductor memory device comprises an electrically data rewritable non-volatile semiconductor memory cell and a write circuit configured to write data to the memory cell by supplying a write voltage and a write control voltage to the memory cell to change the write state of the memory cell, changing the supply of the write control voltage to reduce the rate of changing the write state, further changing the supply of the write control voltage to control the reduced rate of changing the write state and terminating the write operation to the memory cell while the rage of changing the write state is controlled.

Preferred embodiments may include the following.
(1) The write circuit performs a write operation so as to sequentially increase the write voltage when writing data to memory cells.
(2) The write circuit controls the rate of change of the reduced rate of change of the write state by sequentially increasing the write control voltage.
(3) The rate of increase of the write voltage is greater than the rate of increase of the write control voltage.
(4) The write circuit detects if the write state of a memory cell has reached a first level or not and, upon detecting that the write state of the memory cell has reached the first level, it reduces the rate of change of the write state by changing the supply of write control voltage.
(5) The write circuit detects if the write state of a memory cell has reached a second level or not and, upon detecting that the write state of the memory cell has reached the second level, it terminates the write operation to the memory cell.
(6) An embodiment that further comprises word lines connected to the gates of memory cells and bit lines connected to the drains of memory cells, wherein the write circuit supplies a write voltage to the word lines and a write control voltage to the bit lines.
(7) The write circuit writes a data greater than 1 bit in a memory cell.
(8) The write circuit terminates the operation of writing to memory cells when a predetermined period of time has elapsed since the time when it changed the supply of the write control voltage and reduced the rate of change of the write state.

Another embodiment of non-volatile semiconductor memory device comprises an electrically data rewritable non-volatile semiconductor memory cell and a write circuit configured to write data to the memory cell by applying a first verify voltage to the memory cell to detect if the write state of the memory cell has reached a first level or not, applying a write voltage and a write control voltage showing a first effective voltage level to the memory cell when the write state of the memory cell has not reached the first level, applying the write voltage and a write control voltage showing a second effective voltage level that changes with time to the memory cell when the write state of the memory cell has reached the first level, applying a second verify voltage to the memory cell to detect if the write state of the memory cell has reached a second level or not, and prohibiting any write operation to the memory cell by applying the write voltage and the write control voltage showing a third effective voltage level when the write state of the memory cell has reached the second level.

Preferred embodiments may include the following.
(1) An embodiment that further comprises a read circuit adapted to apply a read voltage to memory cells and read out the data stored in the memory cells, wherein the difference between the read voltage and the second verify voltage is greater than the difference between the first verify voltage and the second verify voltage.
(2) The write circuit performs a write operation so as to sequentially increase the write voltage when writing data to memory cells.
(3) The write circuit performs a write operation by sequentially increasing the second effective voltage during the operation of writing data to the memory cells.
(4) The rate of increase of the write voltage is greater than the rate of increase of the second effective voltage.
(5) The write circuit prohibits any operation of writing to memory cells when a predetermined period of time has elapsed since the time when it applied the second effective voltage to the memory cells.
(6) The write circuit writes a data greater than 1 bit in a memory cell.
(7) The write circuit is adapted to write data to the memory cells, changing the write voltage stepwise by a predetermined value at a time, the predetermined value being greater than the difference between the first verify voltage and the second verify voltage.

Still another embodiment of non-volatile semiconductor memory device comprises an electrically data rewritable non-volatile semiconductor memory cell and a write circuit configured to write data to the memory cell by supplying a write voltage and a write control voltage showing a first effective voltage level to the memory cell when the write state of the memory cells has not reached a first level, applying the write voltage and a write control voltage showing a second effective voltage level that changes with time to the memory cell when the write state of the memory cell has reached the first level, and prohibiting any write operation to the memory cell by applying the write voltage and the write control voltage showing a third effective voltage level when the write state of the memory cell has reached the second level.

Preferred embodiments may include the following.
(1) The write circuit performs a write operation so as to sequentially increase the write voltage when writing data to memory cells.
(2) The write circuit performs a write operation so as to sequentially increase the second effective voltage when writing data to memory cells.
(3) The rate of increase of the write voltage is greater than the rate of increase of the second effective voltage.
(4) The write circuit prohibits any operation of writing to memory cells when a predetermined period of time has elapsed since the time when it applied the second effective voltage to the memory cells.
(5) The write circuit writes a data greater than 1 bit in a memory cell.

While the above embodiments are described in terms of storing a 2-bit data, or a 4-valued data, in a single memory cell, it will be appreciated that embodiments adapted to store a higher valued data in a single memory can easily be realized.

Figure 16:
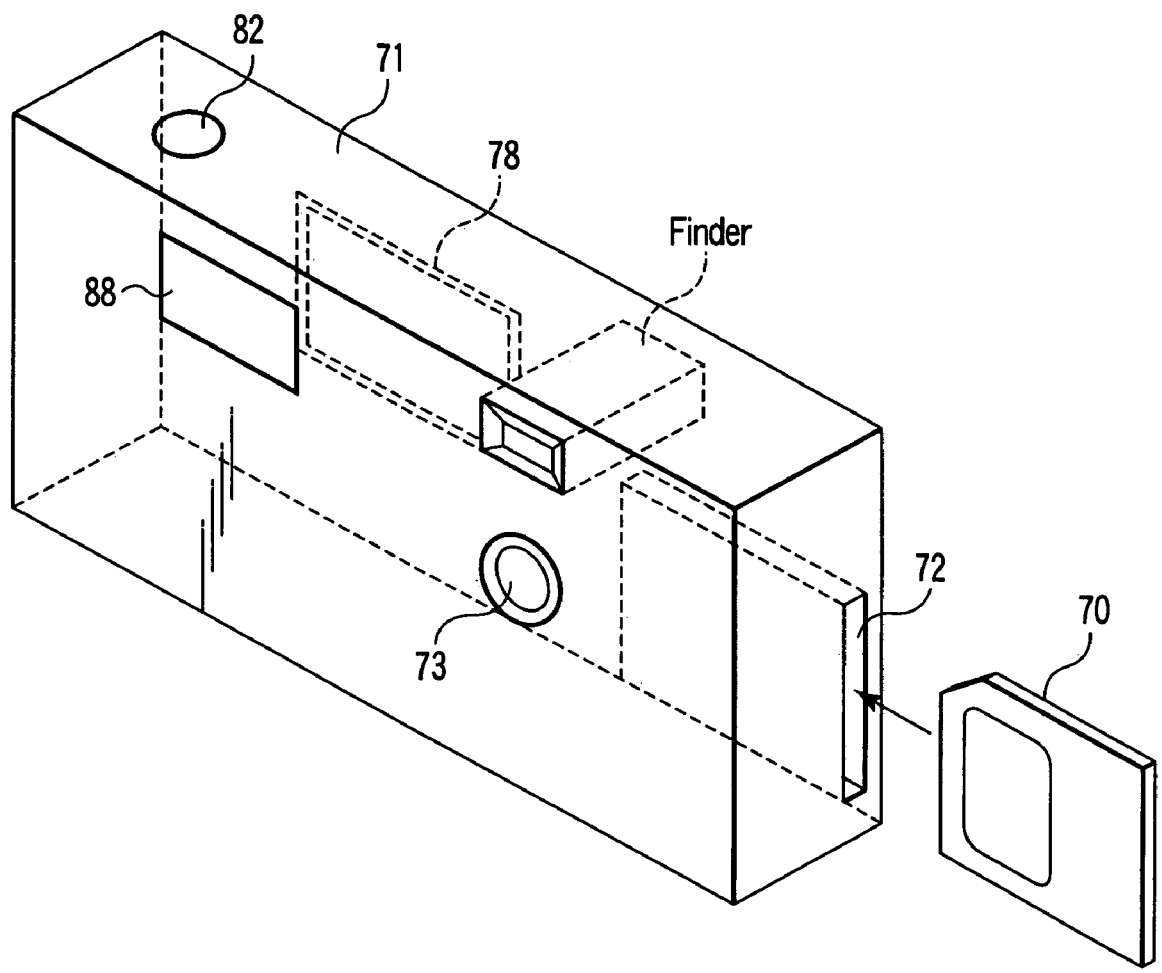
FIG. 16 is a perspective view showing a digital still camera which is one example of an electronic card using the flash memory of FIG. 3.

FIG. 16 shows one example of the constitution of an electronic card using the above-described flash memory, and an electronic apparatus using this electronic card.

Here, as one example of the electronic apparatus, a portable electronic apparatus such as a digital still camera 71 is shown. In an electronic card (e.g., a memory card) 70 for use as a recording medium of the digital still camera 71, an IC package is disposed in which the above-described NAND flash memory is integrated and sealed as described above in the first embodiment.

In the digital still camera 71, a card slot 72 and a circuit substrate connected to the slot are contained. The memory card 70 is detachably attached to the card slot 72, and electrically connected to an electronic circuit on the circuit substrate in the attached state. It is to be noted that when the memory card 70 is, for example, a non-contact type of IC card, the card is contained in or brought close to the card slot 72, and is accordingly electrically connected to the electronic circuit on the circuit substrate by a radio signal.

It is to be noted that in FIG. 16, reference numeral 73 denotes a lens, 78 denotes a display section, for example, including a liquid crystal monitor, 82 denotes an operation button such as a shutter button, 88 denotes a stroboscopic lamp.

Figure 17:
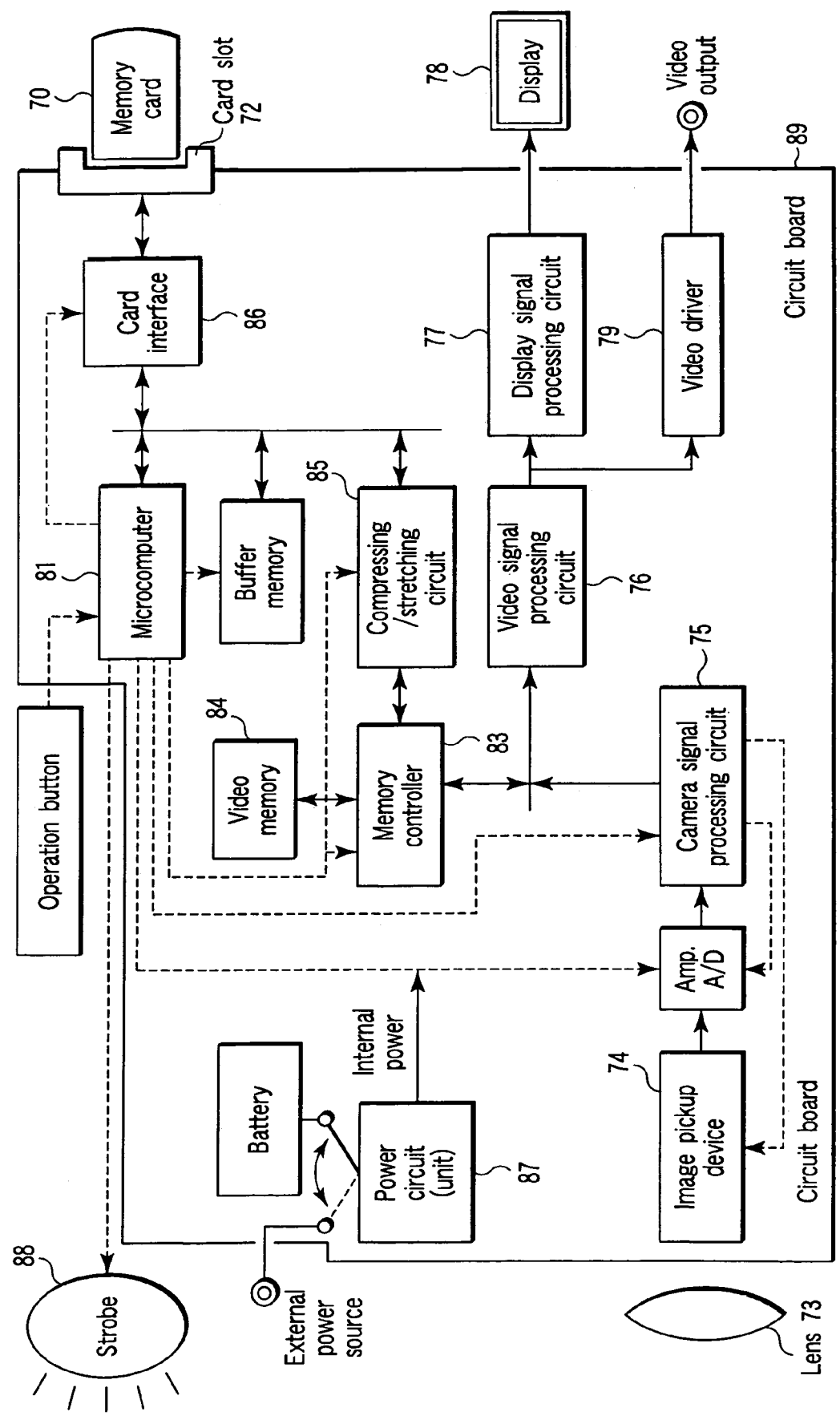
FIG. 17 is a block diagram showing a basic circuit constitution example of the digital still camera shown in FIG. 16.

FIG. 17 shows a basic constitution of the digital still camera shown in FIG. 16.

A light from a subject is converged by the lens 73 and input in an image pickup device 74. For example, the image pickup device 74 formed, for example, of a CMOS image sensor photoelectrically converts the input light to output, for example, an analog signal. This analog signal is amplified by an analog amplifier (AMP), and subsequently digital-converted by an analog to digital converter (ADC). The converted signal is input into a camera signal processing circuit 75, subjected, for example, to an automatic exposure control (AE), automatic white balance control (AWB), and color separation treatment, and thereafter converted into a luminance signal and color difference signal.

To monitor an image, the signal output from the camera signal processing circuit 75 is input into a video signal processing circuit 76, and converted to a video signal. Examples of a system of the video signal include National Television System Committee (NTSC). The image pickup device 74, AMP., ADC, and camera signal processing circuit 75 are controlled by a microcomputer 81.

The video signal is output to a display 78 applied to the digital still camera 71 via a display-signal processing circuit 77. The video signal is given to a video output terminal via a video driver 79.

The image photographed by the digital still camera 71 in this manner can be output as a video output to a video apparatus such as television set via the video output terminal. Accordingly, the photographed image can also be displayed in a section other than the display 78.

To capture the image, an operator presses the operation button 82. Accordingly, the microcomputer 81 controls a memory controller 83, and the signal output from the camera signal processing circuit 75 is written as a frame image in a video memory 84. The frame image written in this manner is compressed based on a predetermined compression format by a compressing/stretching circuit 85, and recorded in the memory card 81 attached to the card slot 72 via a card interface 86.

To reproduce a recorded image, the image recorded in the memory card 70 is read via the card interface 86, stretched by the compressing/stretching circuit 85, and subsequently written in the video memory 84. The written image is input into the video signal processing circuit 76, and reflected in the display 78 or video apparatus in the same manner as in the monitoring of the image.

It is to be noted that in the above-described constitution, on a circuit board 89, the card slot 72, image pickup device 74, AMP., ADC, camera signal processing circuit 75, video signal processing circuit 76, display signal processing circuit 77, video driver 79, microcomputer 81, memory controller 83, video memory 84, compressing/stretching circuit 85, and card interface 86 are mounted. Here, the card slot 72 does not have to be mounted on the circuit board 89, and may also be connected to the circuit board 89 via a connector cable, and the like.

Moreover, further on the circuit board 89, a power circuit 87, for example, including a DC/DC converter, and the like are mounted. The power circuit 87 receives a power supply from an external power source or battery, and generates an internal power voltage for use in the digital still camera 71. The internal power voltage is supplied not only to the above-described circuits but also to the stroboscopic lamp 88 and the display 78.

Figure 18:
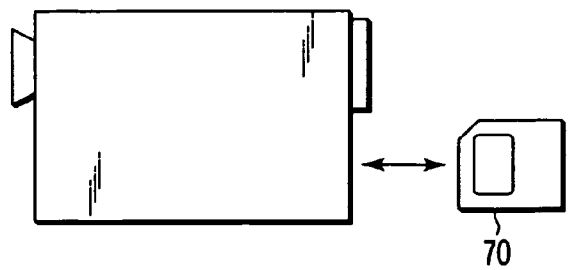
FIG. 18 is a front view schematically showing a constitution example of a digital still camera/video camera.
Figure 19:
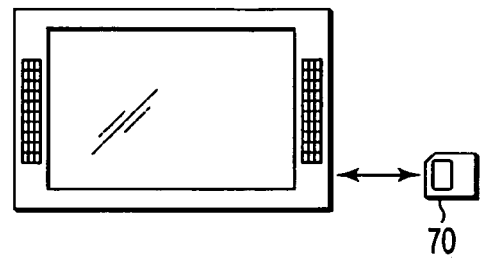
FIG. 19 is a front view schematically showing a constitution example of a television set.
Figure 20:
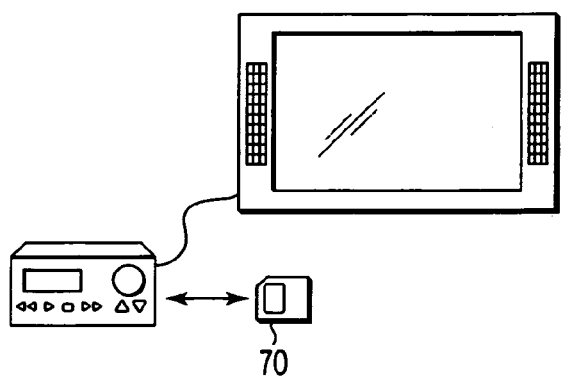
FIG. 20 is a front view schematically showing a constitution example of an audio/visual apparatus.
Figure 21:
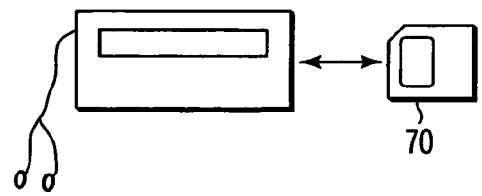
FIG. 21 is a front view schematically showing a constitution example of an audio apparatus.
Figure 22:
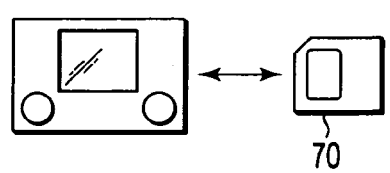
FIG. 22 is a front view schematically showing a constitution example of a game apparatus.
Figure 23:
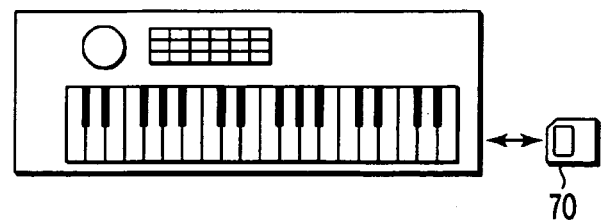
FIG. 23 is a front view schematically showing a constitution example of an electronic musical instrument.
Figure 24:
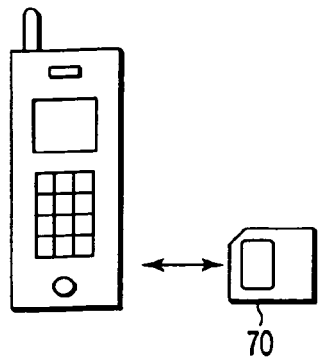
FIG. 24 is a front view schematically showing a constitution example of a cellular phone.
Figure 25:
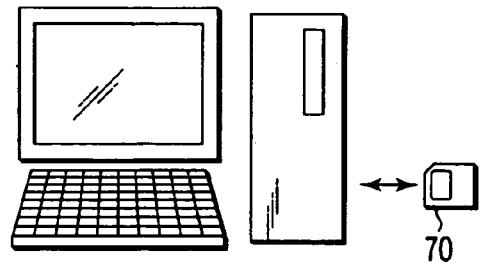
FIG. 25 is a front view schematically showing a constitution example of a personal computer.
Figure 26:
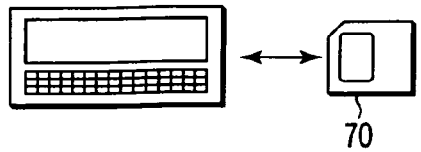
FIG. 26 is a front view schematically showing a constitution example of a personal digital assistant.
Figure 27:
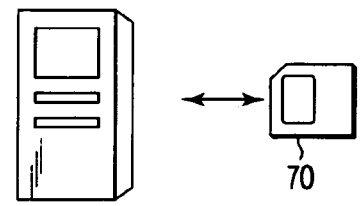
FIG. 27 is a front view schematically showing a constitution example of a voice recorder.
Figure 28:
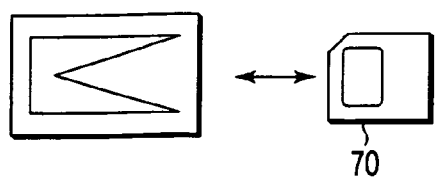
FIG. 28 is a front view schematically showing a constitution example of a PC card.
Figure 29:
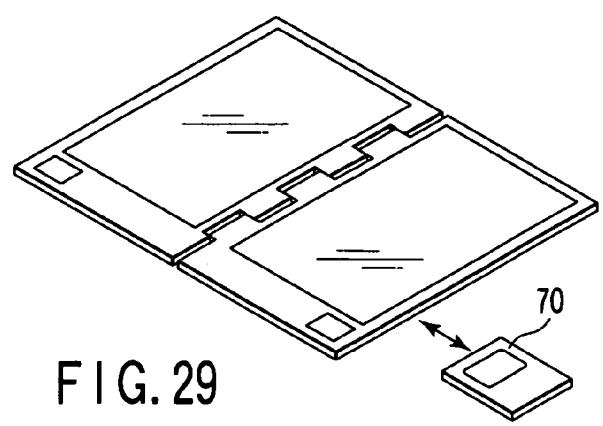
FIG. 29 is a front view schematically showing a constitution example of an electronic book terminal.

The electronic card according to the present embodiment can be applied not only to the portable electronic apparatuses such as the above-described digital still camera but also to various apparatuses schematically shown in, for example, FIGS. 18 to 29. That is, FIG. 18 shows a digital still camera/video camera, FIG. 19 shows a television set, FIG. 20 shows an audio/visual apparatus, FIG. 21 shows an audio apparatus, FIG. 22 shows a game apparatus, FIG. 23 shows an electronic musical instrument, FIG. 24 shows a cellular phone, FIG. 25 shows a personal computer, FIG. 26 shows a personal digital assistant (PDA), FIG. 27 shows a voice recorder, FIG. 28 shows a PC card (e.g., PC card memory), for example, including a mode of PCMCIA standard, and FIG. 29 shows an electronic book terminal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data write method for a non-volatile semiconductor memory device which comprises memory cells for at least a page, first data storage sections and second data storage sections, each of the number of the first data storage sections and the second storage sections corresponding to the number of the memory cells, the method comprising:

receiving data to be written in the memory cells;

storing the data in the first data storage sections;

copying the data from the first data storage sections to the second data storage sections;

selecting an initial value for write voltage;

setting write control voltage to one of a first voltage, a second voltage which is higher than the first voltage, and a third voltage which is higher than the second voltage, the write control voltage being set to the first voltage when both of the data corresponding to the memory cells in the first data storage sections and the data corresponding to the memory cells in the second data storage sections are "0", the write control voltage being set to the second voltage when the data corresponding to the memory cells in the first data storage sections are "0" and the data corresponding to the memory cells in the second data storage sections are "1", the write control voltage being set to the third voltage when the data corresponding to the memory cells in the first data storage sections are "1";

writing the data in the memory cells using the write voltage and the write control voltage;

checking whether or not all the data in the second data storage sections are "1 or more";

determining that a status of a first step is satisfactory when all the data in the second data storage sections are "1 or more", and that the status of the first step is not satisfactory when not all the data in the second data storage sections are "1 or more"; starting a first step write verify operation if the status of the first step is not satisfactory, so that the data having a value of "0" in the second data storage sections, which correspond to the memory cells whose verification result is satisfactory, are changed to "1", and the data having a value of "1 or more" in the second data storage sections, which correspond to the memory cells whose verification result is satisfactory, are increased by 1;

starting a second step write verify operation if the status of the first step is satisfactory or when the first step write verify operation is finished, so that the data having a value of "0" in the first data storage sections, which correspond to the memory cells whose verification result is satisfactory, are changed to "1";

checking, after the second step write verify operation, whether or not all the data in the first data storage sections are "1";

determining that a status of a second step is satisfactory when all the data in the first data storage sections are "1", and that the status of the second step is not satisfactory when not all the data in the first data storage sections are "1";

completing write operation if the status of the second step is satisfactory; and setting the write control voltage to fourth voltage if the status of the second step is not satisfactory, for writing the data in the memory cells using the write voltage and the write control voltage, the fourth voltage being higher than the second voltage and lower than the third voltage.

2. The method according to claim 1, wherein each of the memory cells includes a gate electrode connected with a word line and a transistor having a drain connected with a bit line, and when the data is written in the memory cells, the write voltage is supplied to the word line and the write control voltage is supplied to the bit line.

3. The method according to claim 1, wherein each of the memory cells is connected in series to form a NAND cell.

4. The method according to claim 1, wherein the third voltage is power supply voltage.

5. The method according to claim 1, wherein the non-volatile semiconductor memory device further comprises a counter whose value is increased by 1 when the status of the second step is not satisfactory.

6. The method according to claim 5, further comprising:
judging a write status to be failure to terminate the write operation when the value of the counter exceeds a predetermined value; and
raising the write voltage by a fixed amount of voltage from the initial value, when the value of the counter is less than the predetermined value, for retrying to write the data in the memory cells.

* * * * *